(12) United States Patent
Terada

(10) Patent No.: US 11,081,178 B2
(45) Date of Patent: Aug. 3, 2021

(54) MEMORY, INFORMATION PROCESSING SYSTEM, AND METHOD OF CONTROLLING MEMORY

(71) Applicant: Sony Corporation, Tokyo (JP)

(72) Inventor: Haruhiko Terada, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 15/749,624

(22) PCT Filed: Jun. 14, 2016

(86) PCT No.: PCT/JP2016/067623
§ 371 (c)(1),
(2) Date: Feb. 1, 2018

(87) PCT Pub. No.: WO2017/033534
PCT Pub. Date: Mar. 2, 2017

(65) Prior Publication Data
US 2018/0226125 A1 Aug. 9, 2018

(30) Foreign Application Priority Data
Aug. 27, 2015 (JP) .............................. JP2015-168204

(51) Int. Cl.
*G11C 13/00* (2006.01)
*G11C 5/14* (2006.01)
*G11C 7/22* (2006.01)

(52) U.S. Cl.
CPC .......... *G11C 13/0069* (2013.01); *G11C 5/147* (2013.01); *G11C 13/003* (2013.01);
(Continued)

(58) Field of Classification Search
CPC .................................................. G11C 13/0069
See application file for complete search history.

(56) References Cited

U.S. PATENT DOCUMENTS 5,157,626 A * 10/1992 Watanabe .............. G11C 16/28
365/185.2
2006/0209585 A1* 9/2006 Tanizaki ............ G11C 13/0004
365/148
(Continued)

FOREIGN PATENT DOCUMENTS

| JP | 2011-054259 A | 3/2011 |
| JP | 2015-500548 A | 1/2015 |
| WO | 2013/094169 A1 | 6/2013 |

*Primary Examiner* — Douglas King
(74) *Attorney, Agent, or Firm* — Michael Best & Friedrich LLP

(57) ABSTRACT

Reliability of stored data is improved without increasing power consumption in a case where a threshold of a control element in a memory cell changes. In a memory including the memory cell, a reference cell, and an access control unit, the memory cell changes from a non-conduction state to a conduction state according to an applied voltage at a threshold voltage and changes to a high resistance state and a low resistance state according to the voltage applied in the conduction state. The reference cell changes from a non-conduction state to a conduction state at a reference threshold voltage according to an applied voltage. The access control unit estimates that the reference threshold voltage measured in the reference cell is the threshold voltage of the memory cell and applies a voltage to the memory cell when accessing the memory cell.

17 Claims, 35 Drawing Sheets

(52) U.S. Cl.
CPC ........ *G11C 13/0004* (2013.01); *G11C 13/004* (2013.01); *G11C 13/0059* (2013.01); *G11C 13/0061* (2013.01); *G11C 7/227* (2013.01); *G11C 2013/0054* (2013.01); *G11C 2213/15* (2013.01); *G11C 2213/76* (2013.01); *G11C 2213/79* (2013.01)

(56) References Cited

U.S. PATENT DOCUMENTS

| | | |
|---|---|---|
| 2009/0303785 A1 | 12/2009 | Hwang et al. |
| 2012/0087183 A1* | 4/2012 | Chang ................ G11C 13/0004 365/163 |
| 2014/0063904 A1* | 3/2014 | Yon ...................... G11C 13/004 365/148 |

\* cited by examiner

*FIG. 6*
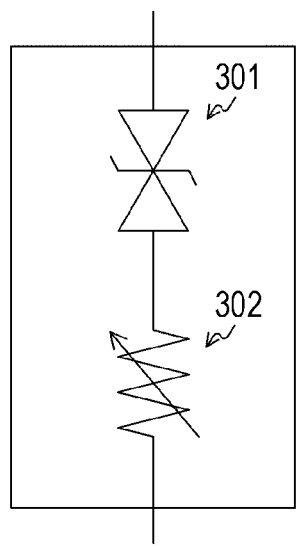
a
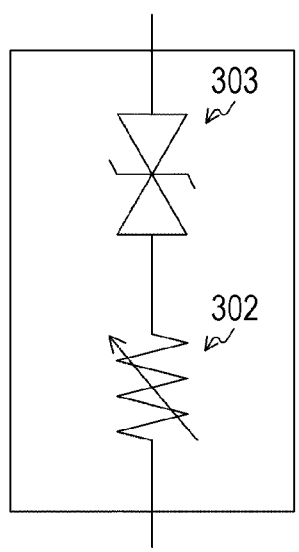
b
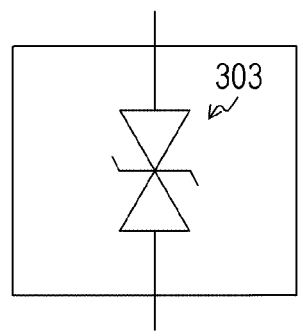
c

FIG. 10
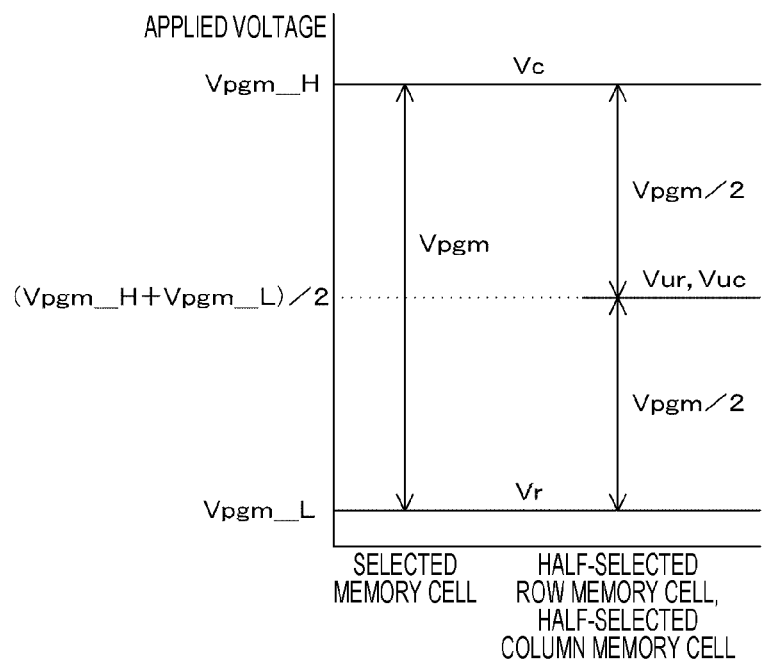
a
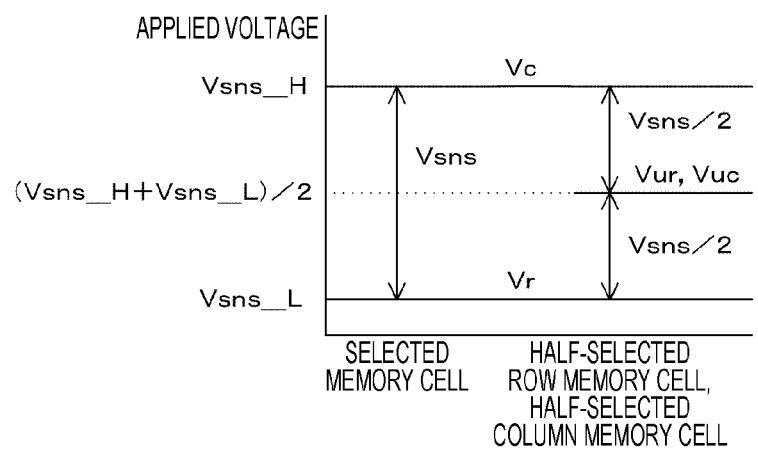
b

FIG. 11

| OPERATION CODE (OP_code) | ENABLE SIGNAL (Enable) | OPERATION | APPLIED VOLTAGE |
|---|---|---|---|
| 2b01 | 1 | SETTING | Vc : Vpgm_H<br>Vr : Vpgm_L<br>Vuc: (Vpgm_H+Vpgm_L)/2<br>Vur: (Vpgm_H+Vpgm_L)/2 |
| 2b10 | 1 | RESETTING | Vc : Vpgm_L<br>Vr : Vpgm_H<br>Vuc: (Vpgm_H+Vpgm_L)/2<br>Vur: (Vpgm_H+Vpgm_L)/2 |
| 2b11 | 1 | READING | Vc : Vsns_H<br>Vr : Vsns_L<br>Vuc: (Vsns_H+Vsns_L)/2<br>Vur: (Vsns_H+Vsns_L)/2 |
| 2b00 | x | — | Vc : (Vsns_H+Vsns_L)/2<br>Vr : (Vsns_H+Vsns_L)/2<br>Vuc: (Vsns_H+Vsns_L)/2<br>Vur: (Vsns_H+Vsns_L)/2 |
| x | 0 | — | Vc : (Vsns_H+Vsns_L)/2<br>Vr : (Vsns_H+Vsns_L)/2<br>Vuc: (Vsns_H+Vsns_L)/2<br>Vur: (Vsns_H+Vsns_L)/2 |

FIG. 23

| OPERATION CODE (OP_code) | ENABLE SIGNAL (Enable) | OPERATION | APPLIED VOLTAGE |
|---|---|---|---|
| 2b01 | 1 | SETTING | Vc : Vpgm_H<br>Vr : Vpgm_L<br>Vuc: VpgmU_L<br>Vur: VpgmU_H |
| 2b10 | 1 | RESETTING | Vc : Vpgm_L<br>Vr : Vpgm_H<br>Vuc: (Vpgm_H+Vpgm_L)/2<br>Vur: (Vpgm_H+Vpgm_L)/2 |
| 2b11 | 1 | READING | Vc : Vsns_H<br>Vr : Vsns_L<br>Vuc: (Vsns_H+Vsns_L)/2<br>Vur: (Vsns_H+Vsns_L)/2 |
| 2b00 | x | — | Vc : (Vsns_H+Vsns_L)/2<br>Vr : (Vsns_H+Vsns_L)/2<br>Vuc: (Vsns_H+Vsns_L)/2<br>Vur: (Vsns_H+Vsns_L)/2 |
| x | 0 | — | Vc : (Vsns_H+Vsns_L)/2<br>Vr : (Vsns_H+Vsns_L)/2<br>Vuc: (Vsns_H+Vsns_L)/2<br>Vur: (Vsns_H+Vsns_L)/2 |

FIG. 24
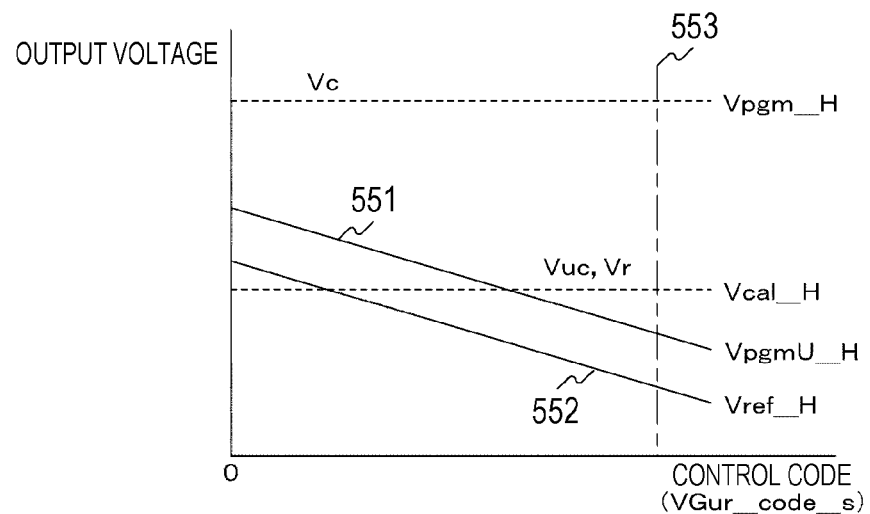
a
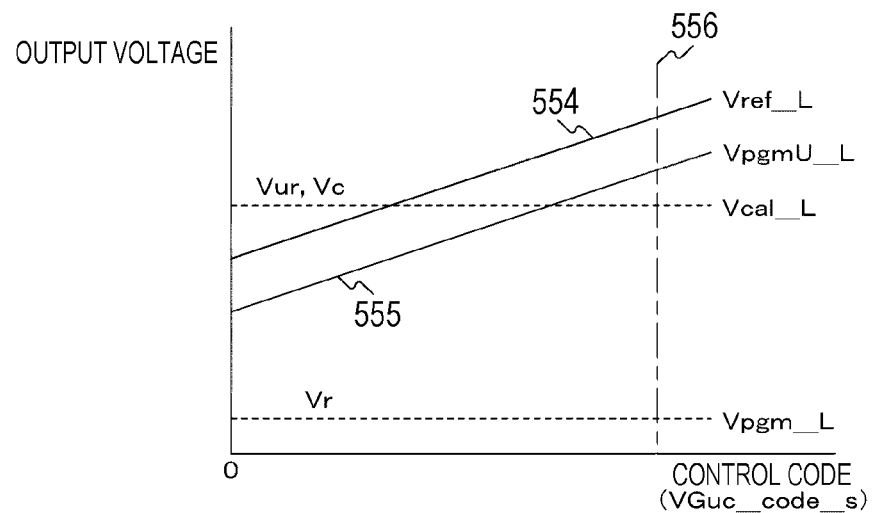
b

FIG. 30

| OPERATION CODE (OP_code) | ENABLE SIGNAL (Enable) | OPERATION | APPLIED VOLTAGE |
|---|---|---|---|
| 2b01 | 1 | SETTING | Vc : Vpgm_H<br>Vr : Vpgm_L<br>Vuc: VpgmU_L<br>Vur: VpgmU_H |
| 2b10 | 1 | RESETTING | Vc : Vpgm_L<br>Vr : Vpgm_H<br>Vuc: VpgmU_H<br>Vur: VpgmU_L |
| 2b11 | 1 | READING | Vc : Vsns_H<br>Vr : Vsns_L<br>Vuc: (Vsns_H+Vsns_L)/2<br>Vur: (Vsns_H+Vsns_L)/2 |
| 2b00 | x | — | Vc : (Vsns_H+Vsns_L)/2<br>Vr : (Vsns_H+Vsns_L)/2<br>Vuc: (Vsns_H+Vsns_L)/2<br>Vur: (Vsns_H+Vsns_L)/2 |
| x | 0 | — | Vc : (Vsns_H+Vsns_L)/2<br>Vr : (Vsns_H+Vsns_L)/2<br>Vuc: (Vsns_H+Vsns_L)/2<br>Vur: (Vsns_H+Vsns_L)/2 |

FIG. 31
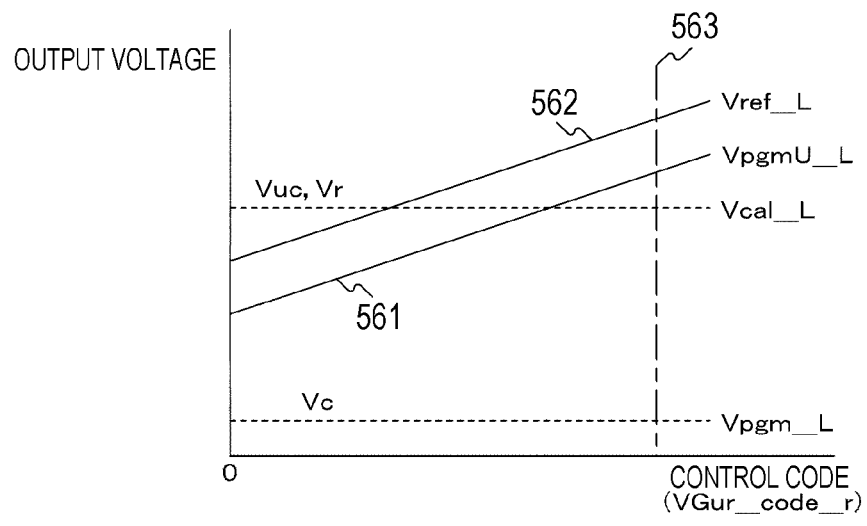
a
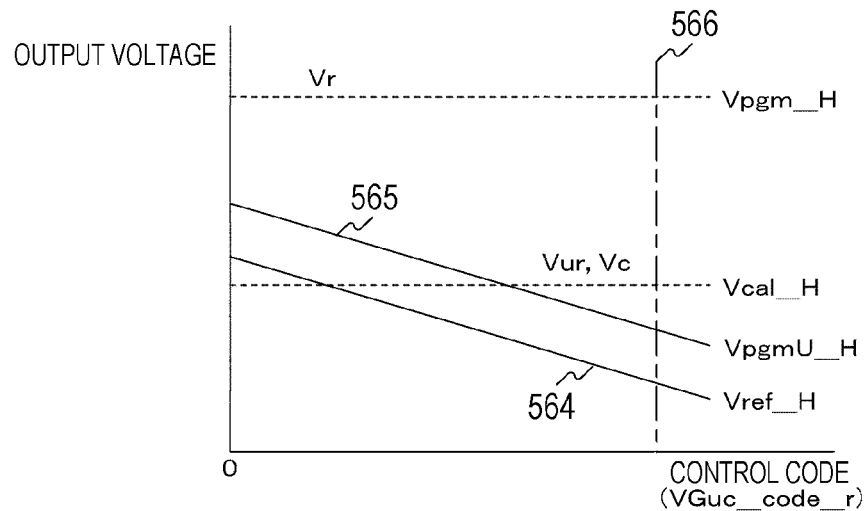
b

MEMORY, INFORMATION PROCESSING SYSTEM, AND METHOD OF CONTROLLING MEMORY

TECHNICAL FIELD

The present technology relates to a memory, an information processing system, and a method of controlling a memory. In detail, the present invention relates to a memory including a memory cell including a control element which changes from a non-conduction state to a conduction state according to an applied voltage, an information processing system, and a method of controlling a memory.

BACKGROUND ART

Conventionally, a memory in which memory cells in each of which a variable resistance element a resistance value of which reversibly changes and a control element which controls the variable resistance element at the time of writing and reading data are connected in series are arranged in a two-dimensional manner is used. The variable resistance element is an element which may change the resistance value by an applied voltage and the like, the element which allows a state in which the resistance is high and a state in which the resistance is low to correspond to, for example, values "0" and "1", respectively to store. As such a memory, a memory including a resistive RAM (ReRAM), a phase-change RAM (PCRAM), a magnetoresistive RAM (MRAM) and the like is known. The control element is an element which controls the voltage to be applied to the variable resistance element. As this control element, a three-terminal type control element having a control electrode like a MOS transistor, a two-terminal type control element simplified by omitting a control electrode and the like are used. In recent years, a memory with a low cost adopting this two-terminal type control element attracts attention. The two-terminal control element is an element which changes to a non-conduction state and a conduction state with a threshold as a boundary according to an applied voltage. Reading of data in a memory cell using this two-terminal type control element is performed by the following procedure. First, a voltage is applied to the memory cell to put the control element into a conduction state, that is, to turn on the same. Next, it is determined whether the resistance value of the variable resistance element is high or low.

The variable resistance element described above has a simple structure and may be accessed at a high speed, but there is a problem that electrical characteristics change. For example, a PCRAM which is a phase change type memory is a memory which changes the resistance value by changing the variable resistance element to a non-crystalline state and a crystalline state, and these states change depending on elapsed time from the writing of data. Therefore, a threshold which is a resistance value for determining whether the resistance of the variable resistance element is high or low also changes according to the elapsed time. Therefore, in accordance with the elapsed time from the writing of the data, a read voltage which is the voltage to be applied to the variable resistance element is changed, and it is determined whether the resistance of the variable resistance element is high or low. Therefore, a system capable of reading the same data as the written data even in a case where the threshold changes is proposed (refer to, for example, Patent Document 1).

CITATION LIST

Patent Document

Patent Document 1: US Patent Application Publication No. 2009/0303785 Specification

SUMMARY OF THE INVENTION

Problems to be Solved by the Invention

As described above, the two-terminal type control element is the element which changes from the non-conduction state to the conduction state when the voltage exceeding the threshold is applied and returns to the non-conduction state when the application of the voltage is stopped. That is, as is the case with the variable resistance element, the resistance value of which changes in accordance with the applied voltage. A case where the threshold voltage of the two-terminal type control element changes according to the elapsed time from previous turn-on operation is assumed. For example, when the threshold voltage changes to a higher threshold voltage than that at the time of the previous turn-on operation, even if the same voltage as the previous one is applied to the memory cell, the applied voltage becomes relatively lower than the threshold voltage after the change, so that the control element cannot be made sufficiently conductive. Therefore, even in a state in which the resistance of the variable resistance element is low, it is determined to be a high resistance state and data different from the stored data is read, and as a result, reliability of stored data problematically decreases. By applying a high voltage taking change in the threshold voltage into consideration to the memory cell, it is possible to turn on the control element regardless of the elapsed time from the previous turn-on operation. However, in this case, since a relatively high voltage is applied to the memory cell and reading is performed, power consumption at the time of reading problematically increases.

The present technology is achieved in view of such a situation and an object thereof is to improve the reliability of the stored data without increasing the power consumption in a case where the threshold of the control element in the memory cell changes.

Solutions to Problems

The present technology is achieved for solving the above-described problem, and a first aspect thereof is a memory including a memory cell which changes from a non-conduction state to a conduction state according to an applied voltage at a threshold voltage and changes to a high resistance state and a low resistance state according to a voltage applied in the conduction state, a reference cell including a reference element which changes from a non-conduction state to a conduction state according to an applied voltage at a reference threshold voltage, and an access control unit which estimates the reference threshold voltage measured in the reference cell to be the threshold voltage of the memory cell and applies a voltage to the memory cell at the time of access to the memory cell, and a method of controlling a memory. As a result, there is an effect that the threshold voltage of the memory cell is estimated by the reference threshold voltage and the voltage is applied to the memory cell.

Also, in the first aspect, the memory cell may include a control element which changes from the non-conduction state to the conduction state according to an applied voltage at the threshold voltage, and a variable resistance element which changes to the high resistance state and the low resistance state according to an applied voltage. As a result, there is an effect that the threshold voltage of the control element of the memory cell is estimated by the reference threshold voltage.

Also, in the first aspect, the access control unit may change the reference element from the non-conduction state to the conduction state to measure the reference threshold voltage at the time of reading. As a result, there is an effect that change from the non-conduction state to the conduction state in the memory cell and that in the reference element are synchronized with each other.

Also, in the first aspect, the data cell may be accessed in units of pages divided according to a page size, the reference cell may be arranged for each of the pages, and the access control unit may estimate that the reference threshold voltage is the threshold voltage of the memory cell for each page and apply a voltage to the memory cell. As a result, there is an effect that the reference threshold voltage is estimated for each page and the threshold voltage of the memory cell is estimated.

Also, in the first aspect, a plurality of reference cells may be arranged for each page, and the access control unit may estimate the threshold voltage of the memory cell by reference threshold voltages in the plurality of reference cells. As a result, there is an effect that the threshold voltage of the memory cell is estimated by a plurality of measured reference threshold voltages.

Also, in the first aspect, the access control unit may change the reference element from the non-conduction state to the conduction state to measure the reference threshold voltage at the time of reading in the page. As a result, there is an effect that change from the non-conduction state to the conduction state in the memory cell and that in the reference element are synchronized with each other for each page.

Also, in the first aspect, in a case where there is the memory cell in the high resistance state after writing in the page, the access control unit may change the memory cell in the low resistance state of the page to the conduction state, set elapsed time after the change to be substantially equal to or shorter than the elapsed time of the memory cell in the high resistance state, and estimate the reference threshold voltage to be the threshold voltage of the memory cell in the page. As a result, there is an effect that change from the non-conduction state to the conduction state in the memory cell in the high resistance state and that in the low resistance state are synchronized with each other.

Also, in the first aspect, a plurality of row signal lines and a plurality of column signal lines arranged in an XY matrix pattern are further provided, and a plurality of memory cells may be arranged at intersections of the plurality of row signal lines and the plurality of column signal lines to be connected to one of the plurality of row signal lines at the intersections and one of the plurality of column signal lines at the intersections, the reference cell may be arranged for each of the plurality of memory cells, and the access control unit may estimate the reference threshold voltage of the reference cell arranged for each of the plurality of memory cells to be the threshold voltage of the memory cell and apply a voltage to each of the memory cells. As a result, there is an effect that the threshold voltages of the memory cells wired by a plurality of row signal lines and a plurality of column signal lines are estimated by the reference threshold voltage and the voltages are applied to the memory cells.

Also, in the first aspect, the access control unit may select one of the plurality of row signal lines and one of the plurality of column signal lines to perform the access. As a result, there is an effect that the threshold voltage of the memory cell connected to the selected row signal line and the selected column signal line is estimated by the reference threshold voltage.

Also, in the first aspect, when the access control unit writes in the memory cell connected to a selected row signal line being one of the plurality of row signal lines and a selected column signal line being one of the plurality of column signal lines, the access control unit may estimate a threshold voltage of a half-selected row memory cell being the memory cell connected to the selected row signal line and a column signal line other than the selected column signal line and a threshold voltage of a half-selected column memory cell being the memory cell connected to the selected column signal line and a row signal line other than the selected row signal line by the reference threshold voltage and apply a voltage to the half-selected row memory cell and the half-selected column memory cell. As a result, there is an effect that the threshold voltages of the half-selected row memory cell and the half-selected column memory cell are estimated by the reference threshold voltage.

Also, in the first aspect, an error detecting/correcting unit which performs error detection and error correction on read data according to the access is further provided, and the access control unit may estimate the reference threshold voltage to be the threshold voltage of the memory cell when an error of the read data is detected by the error detecting/correcting unit and apply a voltage to the memory cell. As a result, there is an effect that the threshold voltage of the memory cell is estimated by the reference threshold voltage in a case where the error is detected.

Also, a second aspect of the present technology is an information processing system including a memory including a memory cell which changes from a non-conduction state to a conduction state according to an applied voltage at a threshold voltage and changes to a high resistance state and a low resistance state according to a voltage applied in the conduction state, a reference cell including a reference element which changes from a non-conduction state to a conduction state according to an applied voltage at a reference threshold voltage, and an access control unit which estimates the reference threshold voltage measured in the reference cell to be the threshold voltage of the memory cell and applies a voltage to the memory cell at the time of access to the memory cell, and a host computer which accesses to the memory. As a result, there is an effect that the threshold voltage of the memory cell is estimated by the reference threshold voltage and the voltage is applied to the memory cell.

Effects of the Invention

According to the present technology, there may be an excellent effect that reliability of stored data is improved without increasing power consumption in a case where a threshold of a control element in a memory cell changes. Meanwhile, the effects are not necessarily limited to the effects herein described and may include any of the effects described in the present disclosure.

BRIEF DESCRIPTION OF DRAWINGS

FIG. 6 is a view illustrating a configuration example of a memory cell and a reference cell in the first embodiment of the present technology.

FIG. 10 is a view illustrating an applied voltage of the memory cell in the first embodiment of the present technology.

FIG. 11 is a view illustrating an operation code in the first embodiment of the present technology.

FIG. 23 is a view illustrating an operation code in the fourth embodiment of the present technology.

FIG. 24 is a view illustrating output voltages of an unselected row applied voltage generating unit 260 and an unselected column applied voltage generating unit 270 in the fourth embodiment of the present technology.

FIG. 30 is a view illustrating an operation code in a fifth embodiment of the present technology.

FIG. 31 is a view illustrating output voltages of an unselected row applied voltage generating unit 260 and an unselected column applied voltage generating unit 270 in the fifth embodiment of the present technology.

MODE FOR CARRYING OUT THE INVENTION

A mode for carrying out the present technology (hereinafter, referred to as an embodiment) is hereinafter described. The description is given in the following order.

1. First Embodiment (Example of Case of Estimating Threshold Voltage of Memory Cell by Reference Threshold Voltage of Reference Element)
2. Second Embodiment (Example of Case of Estimating by Reference Threshold Voltage on the Basis of Results of Error Detection and the Like on Read Data)
3. Third Embodiment (Example of Case Including Two Reference Elements for Each Page)
4. Fourth Embodiment (Example of Case of Estimating Threshold Voltage of Half-Selected Row Memory Cell and Half-Selected Column Memory Cell by Reference Threshold Voltage at Time of Setting)
5. Fifth Embodiment (Example of Case of Estimating Threshold Voltages of Half-Selected Row Memory Cell and Half-Selected Column Memory Cell by Reference Threshold Voltage at Time of Setting and Resetting)
6. Sixth Embodiment (Example of Case of Using Memory Cell Including Unidirectional Variable Resistance Element and Control Element)
7. Seventh Embodiment (Example of Case of Using Memory Cell Including Single Element)

1. First Embodiment

[Configuration of Information Processing System]

Figure 1:
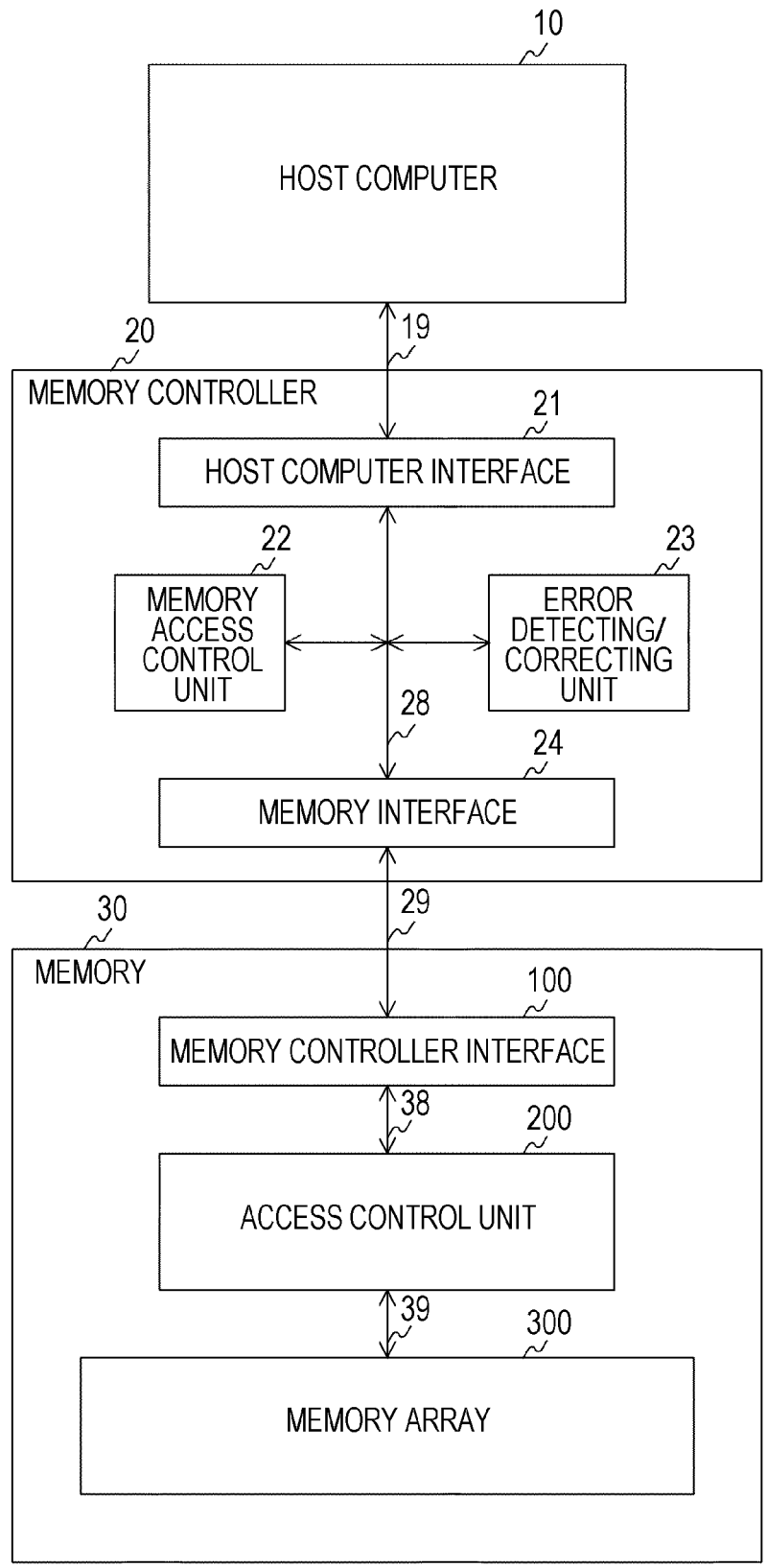
FIG. 1 is a view illustrating a configuration example of an information processing system in an embodiment of the present technology.

FIG. 1 is a view illustrating a configuration example of an information processing system in an embodiment of the present technology. The information processing system in this drawing is provided with a host computer 10, a memory controller 20, and a memory 30.

The host computer 10 performs various types of processing in the information processing system. The host computer 10 issues a write command, a read command or the like to the memory 30 through the memory controller 20 to access. A signal line 19 is a signal line which electrically connects the host computer 10 to the memory controller 20.

The memory controller 20 controls the memory 30. The memory controller 20 interprets the write command and the read command issued from the host computer 10 and issues a write request and a read request based on them to the memory 30.

The memory 30 stores data. The data is accessed on the basis of the request issued by the memory controller 20. At that time, the data is transferred between the memory 30 and the memory controller 20. The memory 30 is assumed to be a memory including a ReRAM being a nonvolatile memory. The ReRAM being a variable resistance memory is a memory including a variable resistance element which reversibly changes a resistance value to store. A signal line 29 is a signal line which electrically connects the memory controller 20 to the memory 30.

At the time of writing, the host computer 10 issues the write command, and write data, a write destination address, and the number of write data accompanying with the same to the memory controller 20. The memory controller 20 interprets the issued write command and issues the write request to the memory 30 on the basis of the write data, the write destination address, and the number of write data accompanying with the same. The memory 30 performs writing on the basis of the request.

On the other hand, at the time of reading, the host computer 10 issues the read command, and a read destination address and the number of read data accompanying with the same to the memory controller 20. The memory controller 20 interprets the command and issues the read request to the memory 30 on the basis of the read destination address and the number of read data accompanying with the same. The memory 30 performs reading on the basis of the request and outputs the read data to the memory controller 20. The memory controller 20 outputs the output data to the host computer 10 as the read data.

[Configuration of Memory Controller]

The memory controller 20 is provided with a host computer interface 21, a memory access control unit 22, an error detecting/correcting unit 23, and a memory interface 24.

The host computer interface 21 is an interface which communicates with the host computer 10.

The memory access control unit 22 controls access to the memory 30. The memory access control unit 22 controls an entire memory controller 20, and interprets the command issued by the host computer 10 to generate the request based on the same.

The error detecting/correcting unit 23 encodes the write data and decodes the read data. Herein, encoding is processing of adding parity to the write data to obtain an error detection and correction code (ECC). Parity generated by using a Bose-Chaudhuri-Hocquenghem (BCH) code may be used, for example, as the parity. Also, decoding is processing of extracting original data from the ECC. At the time of decoding, error detection and error correction of the data are performed.

The memory interface 24 is an interface which communicates with the memory 30.

A bus 28 is a bus which connects respective units of the memory controller 20 to one another. A signal line 29 is a signal line which electrically connects the memory controller 20 to the memory 30.

[Configuration of Memory]

The memory 30 is provided with a memory controller interface 100, an access control unit 200, and a memory array 300.

The memory controller interface 100 is an interface which communicates with the memory controller 20.

The access control unit 200 controls an entire memory 30. Also, the access control unit 200 interprets the request issued by the memory controller 20, and performs writing and reading of the data to and from the memory array 300. A configuration of the access control unit 200 is described later in detail.

The memory array 300 is controlled by the access control unit 200 to store the data. The memory array 300 is accessed by a page address in units of pages. Meanwhile, a size of the write data and the read data in the request generated by the memory controller 20 is assumed to be one page. A configuration of the memory array 300 is described later in detail.

[Configuration of Access Control Unit]

Figure 2:
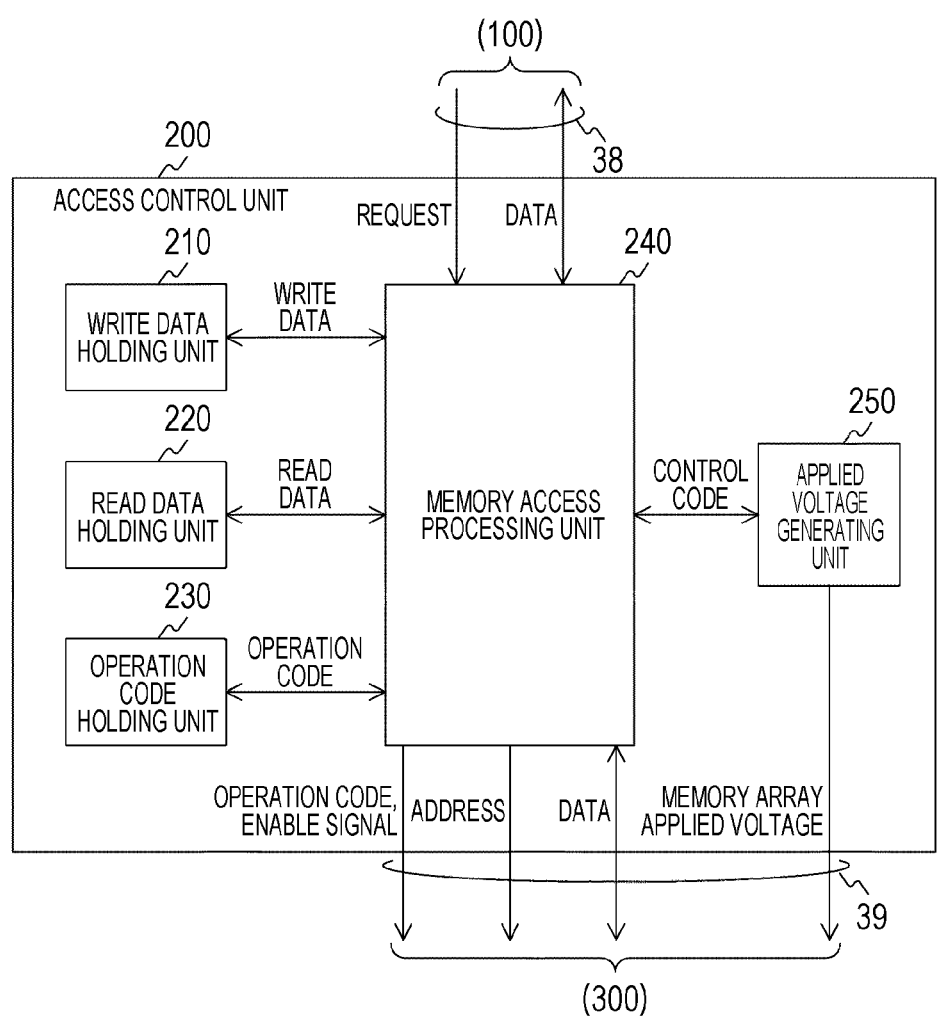
FIG. 2 is a view illustrating a configuration example of an access control unit 200 in a first embodiment of the present technology.

FIG. 2 is a view illustrating a configuration example of the access control unit 200 in a first embodiment of the present technology. The access control unit 200 is provided with a write data holding unit 210, a read data holding unit 220, an operation code holding unit 230, a memory access processing unit 240, and an applied voltage generating unit 250.

The write data holding unit 210 holds the write data to the memory array 300. The write data holding unit 210 holds the write data of one page accompanying with the write request issued by the memory controller 20.

The read data holding unit 220 holds the read data from the memory array 300. The read data holding unit 220 holds the read data of one page based on the read request issued by the memory controller 20. Thereafter, the read data is output to the memory controller 20 by the memory access processing unit 240. Also, the read data holding unit 220 further holds the read data by the reading of the data performed prior to the writing of the data in processing of the write request.

The operation code holding unit 230 holds an operation code. Herein, the operation code indicates an instruction to the memory array 300. The operation code holding unit 230 holds the operation codes for each of memory array units and a reference array unit included in the memory array 300 to be described later. Also, the operation code holding unit 230 outputs the held operation code to a corresponding memory array unit and the like. The operation code is described later in detail.

The applied voltage generating unit 250 generates a voltage to be applied to the memory array 300. The applied voltage generating unit 250 generates an applied voltage on the basis of a control code output by the memory access processing unit 240. Processing in the applied voltage generating unit 250 is described later in detail.

The memory access processing unit 240 performs access processing to the memory array 300. Also, the memory access processing unit 240 controls an entire access control unit 200. When the request is input, the memory access processing unit 240 interprets the input request and outputs the operation code, an enable signal, and the address to the memory array 300. Herein, the enable signal is a signal which gives an instruction to apply the voltage generated by the applied voltage generating unit 250 to a memory cell of the memory array 300 to be described later. Also, the memory access processing unit 240 bidirectionally exchanges the data with the memory array 300. Furthermore, the memory access processing unit 240 controls the voltage to be applied to the memory cell of the memory array 300 by controlling the applied voltage generating unit 250 by outputting the control code. Processing in the memory access processing unit 240 is described later in detail.

[Configuration of Memory Array]

Figure 3:
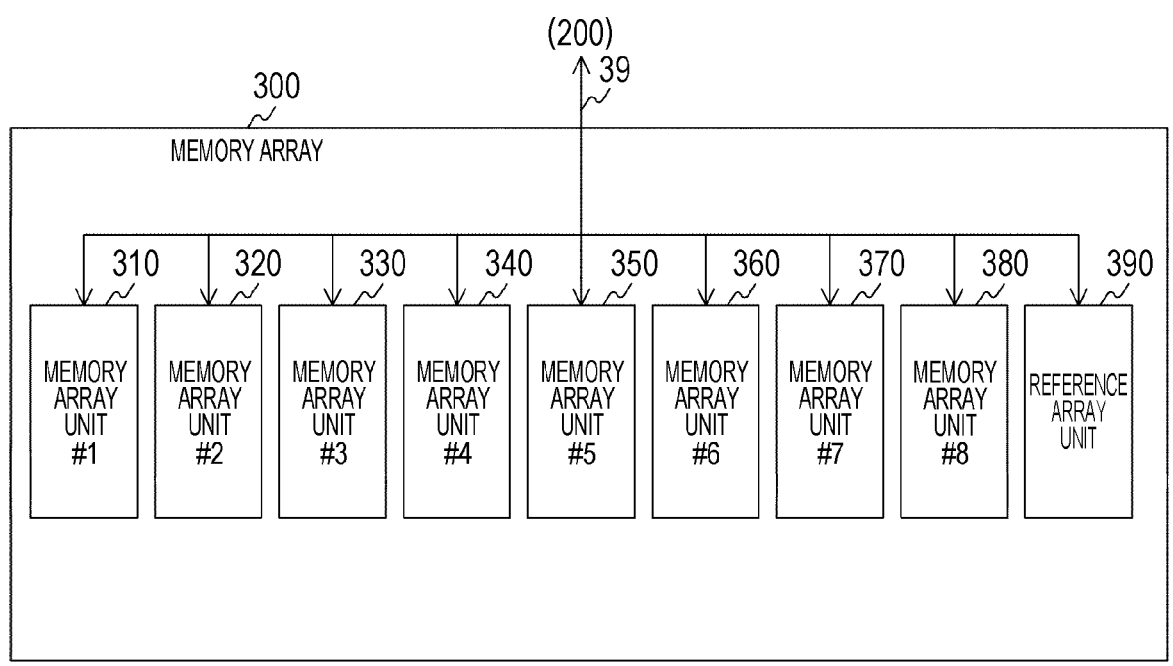
FIG. 3 is a view illustrating a configuration example of a memory array 300 in the first embodiment of the present technology.

FIG. 3 is a view illustrating a configuration example of the memory array 300 in the first embodiment of the present technology. The memory array 300 is provided with memory array units #1 (310) to #8 (380) and a reference array unit 390.

Each of the memory array units #1 (310) to #8 (380) includes the memory cells each of which stores one-bit data arranged in an array. Herein, the memory cell includes a control element and the variable resistance element described later in detail. Each of the memory array units #1 (310) to #8 (380) applies a voltage to the memory cell on the basis of the operation code, the enable signal, and the address output by the memory access processing unit 240. Also, the memory array units #1 (310) to #8 (380) to which the same address is input are simultaneously accessed. That is, the number of memory array units corresponds to a bit length of one page. In the example in this drawing, eight bits correspond to one page.

The reference array unit 390 includes reference cells arranged in an array. Herein, the reference cell is provided with a reference element for estimating a threshold voltage of the control element of the memory cell. A configuration of the reference cell is described later in detail.

[Configuration of Memory Array Unit]

Figure 4:
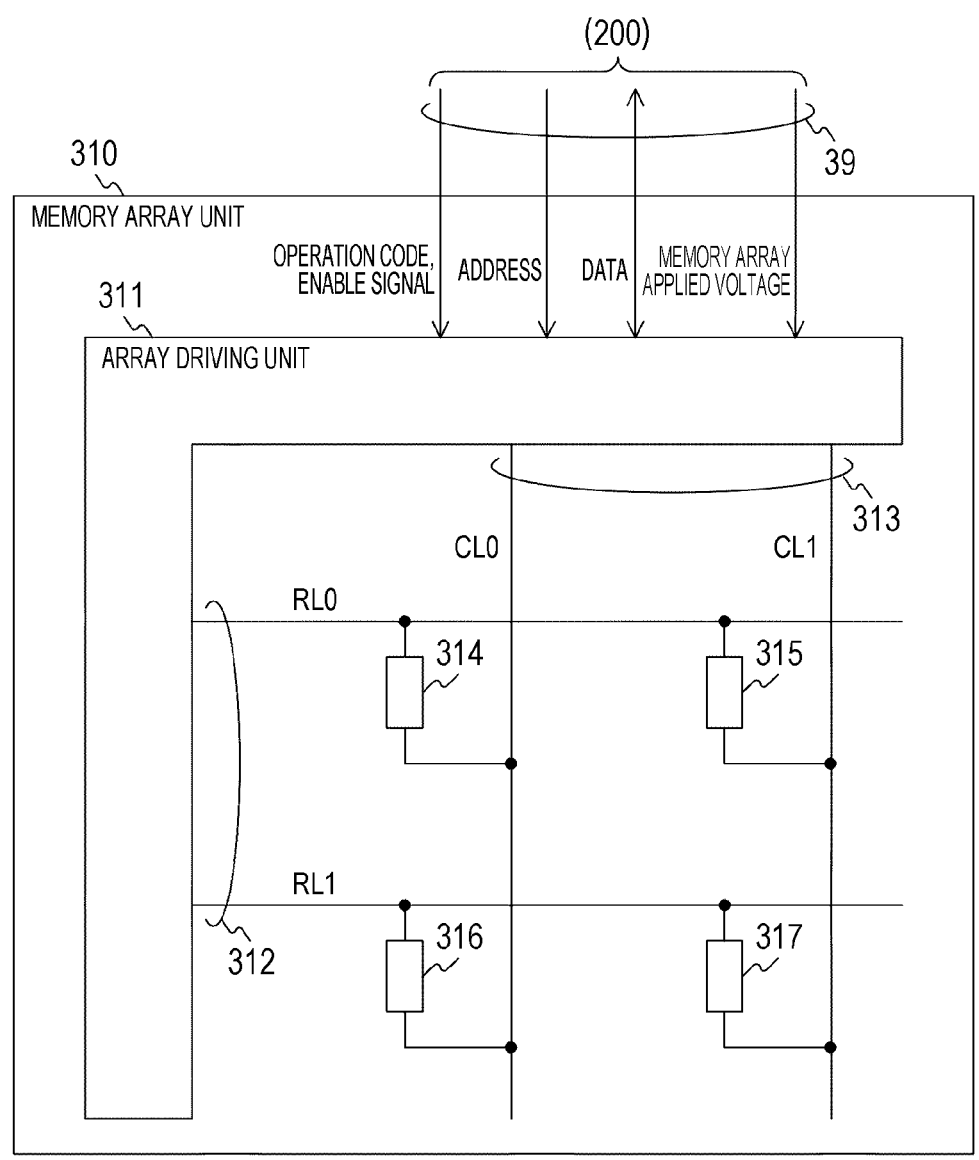
FIG. 4 is a view illustrating a configuration example of a memory array unit 310 in the first embodiment of the present technology.

FIG. 4 is a view illustrating a configuration example of the memory array unit 310 in the first embodiment of the present technology. The memory array unit 310 is provided with an array driving unit 311, a row signal line 312, a column signal line 313, and memory cells 314 to 317. For the sake of convenience, it is assumed that the memory array unit 310 in this drawing is provided with four memory cells, two row signal lines 312, and two column signal lines 313. Meanwhile, each of the memory array units #2 (320) to #8 (380) has the same configuration as that of the memory array unit 310 in this drawing, so that the description thereof is omitted.

The row signal lines 312 and the column signal lines 313 transmit voltages to be applied to the memory cells 314 to 317. They are arranged in an XY matrix pattern.

Each of the memory cells 314 to 317 provided with the variable resistance element and the control element stores one-bit data. The variable resistance element is an element which changes to a high resistance state and a low resistance state according to the applied voltage. The data is stored by switching between the high resistance state and the low resistance state. The control element is an element which changes from a non-conduction state to a conduction state at the threshold voltage according to the applied voltage. The voltage to be applied to the variable resistance element is controlled by the control element.

The memory cells 314 to 317 are arranged at intersections of the row signal lines 312 and the column signal lines 313 arranged in the XY matrix pattern described above. Furthermore, one end of each of the memory cells 314 to 317 is connected to the row signal line 312, and the other end thereof is connected to the column signal line 313. Specifically, one end of the memory cell 314 is connected to the row signal line referred to as "RL0" out of the row signal lines 312, and the other end thereof is connected to the column signal line referred to as "CL0" out of the column signal lines 313. A configuration of each of the memory cells 314 to 317 is described later in detail.

The array driving unit 311 drives the memory cells 314 to 317. The array driving unit 311 selects one from the row signal lines 312 and one from the column signal lines 313 on the basis of the address output by the access control unit 200. Hereinafter, the selected row signal line 312 and the selected column signal line 313 are referred to as a selected row signal line and a selected column signal line, respectively. Thereafter, when the enable signal is output, the array driving unit 311 outputs the applied voltage generated by the applied voltage generating unit 250 to the selected row signal line and the selected column signal line. As a result, a voltage is applied to the memory cell 314 and the like connected to the selected row signal line and the selected column signal line, and the writing and reading are performed. The array driving unit 311 performs the writing and reading by changing polarity of the voltage applied to the memory cells 314 to 317 on the basis of the operation code output by the access control unit 200. Also, the array driving unit 311 bidirectionally exchanges the data regarding the writing and reading with the access control unit 200.

On the other hand, the array driving unit 311 further applies a voltage to the row signal line 312 other than the above-described selected row signal line and the column signal line 313 other than the above-described selected column signal line. Hereinafter, the row signal line 312 other than the selected row signal line is referred to as an unselected row signal line, and the column signal line 313 other than the selected column signal line is referred to as an unselected column signal line. Voltages to be applied to the selected row signal line and the like is described later in detail.

[Configuration of Reference Array Unit]

Figure 5:
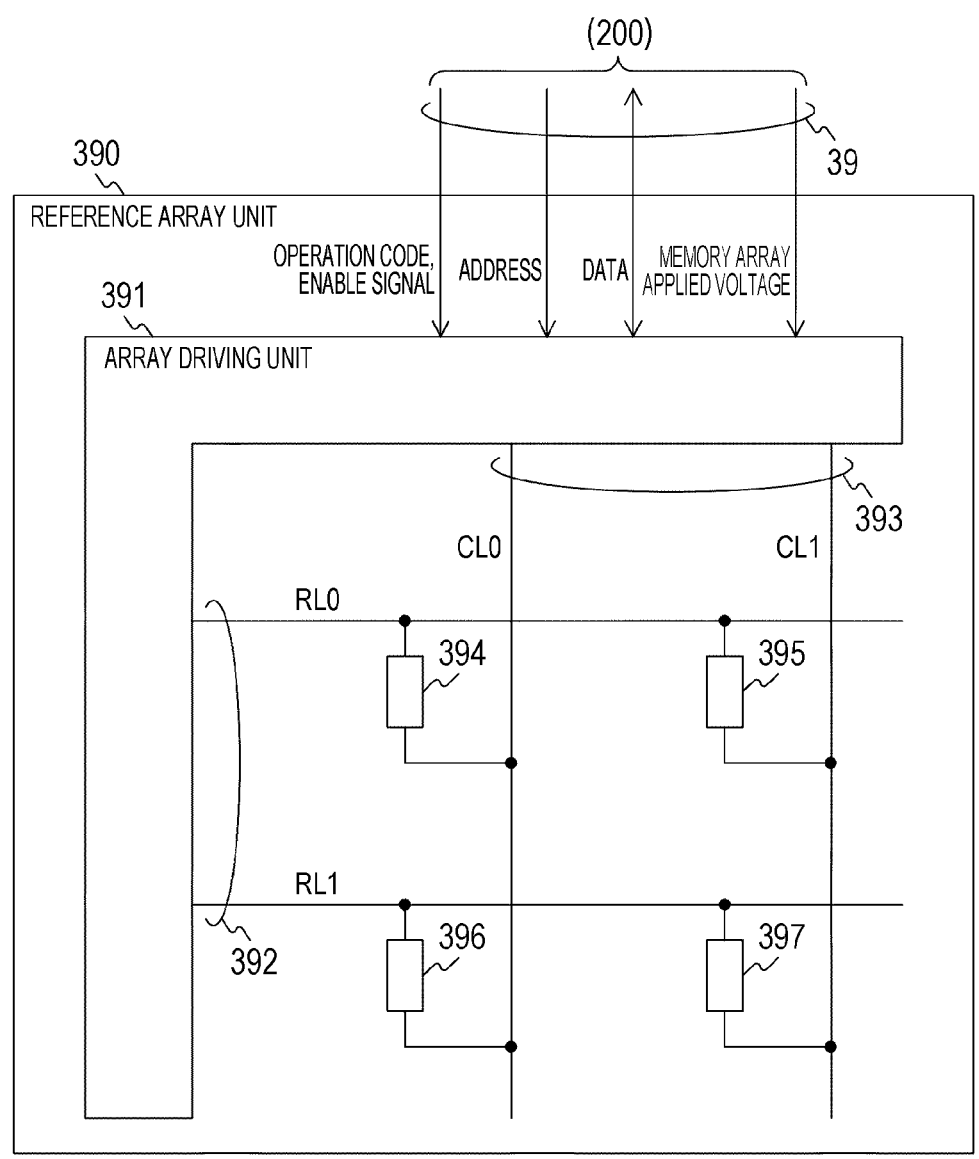
FIG. 5 is a view illustrating a configuration example of a reference array unit 390 in the first embodiment of the present technology.

FIG. 5 is a view illustrating a configuration example of the reference array unit 390 in the first embodiment of the present technology. The reference array unit 390 is provided with an array driving unit 391, a row signal line 392, a column signal line 393, and reference cells 394 to 397.

Each of the reference cells 394 to 397 is provided with the reference element. The reference element is an element which changes from a non-conduction state to a conduction state at a reference threshold voltage according to an applied voltage. The reference threshold voltage is estimated to be the threshold voltage of the control element included in the memory cells 314 to 317 illustrated in FIG. 4, and the voltage is applied to the memory cell 314 and the like at the time of access. Therefore, the reference cells 394 to 397 one-to-one correspond to the memory cells 314 to 317, respectively, and the reference threshold voltage is measured in the corresponding one of the reference cells 394 to 397 prior to the access to the memory cell 314 and the like.

The array driving unit 391 applies the voltage generated by the applied voltage generating unit 250 to the reference cells 394 to 397 to perform the reading and outputs the read data to the access control unit 200. At that time, the reference threshold voltage is measured by checking change of the read data while increasing the voltage to be applied to the reference cell 394 and the like. Since a configuration of the array driving unit 391 other than this is similar to the configuration of the array driving unit 311, the description thereof is omitted.

Since configurations of the row signal line 392 and the column signal line 393 and arrangement of the reference cells 394 to 397 are similar to the configurations of the row signal line 312 and the column signal line 313 and the arrangement of the memory cells 314 to 317 illustrated in FIG. 4, description thereof is omitted.

[Configurations of Memory Cell and Reference Cell]

FIG. 6 is a view illustrating configuration examples of the memory cell and the reference cell in the first embodiment of the present technology. a of this drawing illustrates the configuration example of the memory cell, the example of the memory cell including a control element 301 and a variable resistance element 302 connected in series.

The variable resistance element 302 has two states of the high resistance state and the low resistance state as described above, and stores the data by switching between the two states. Hereinafter, the high resistance state is referred to as HRS and the low resistance state is referred to as LRS. An element in which an ion supply layer and an insulating layer are stacked may be used as the variable resistance element 302. As ions supplied from the ion supply layer diffuse into the insulating layer, the variable resistance element 302 is put into LRS. On the other hand, in a case where the ions which diffuse into the insulating layer return to the ion supply layer, the variable resistance element 302 is put into HRS.

This ion diffusion and the like changes depending on the polarity of a write voltage to be applied to the variable resistance element 302. That is, in a case where the write voltage is applied in a direction in which the ions diffuse, the variable resistance element 302 may be put into LRS from HRS. On the other hand, in a case where the write voltage having opposite polarity is applied, the variable resistance element 302 returns from LRS to HRS. The data writing is performed by reversibly changing the variable resistance element 302 to HRS and LRS in this manner. Meanwhile, in a case of reading the data, it is possible to read by applying a read voltage having a lower absolute value than that of the write voltage to the variable resistance element 302 and determining whether it is in HRS or LRS by a value of current which flows therethrough.

The control element 301 has the two states of the non-conduction state and the conduction state as described above, and controls the voltage to be applied to the variable resistance element 302. The control element 301 having a non-linear relationship between the applied voltage and the flowing current changes from the non-conduction state to the conduction state when the voltage not lower than the threshold voltage is applied thereto. When the voltage application to the control element 301 in the conduction state is stopped, the element returns to its original non-conduction state. That is, by changing the applied voltage, the control element 301 reversibly changes to the non-conduction state and the conduction state. Furthermore, the control element 301 is a bidirectional element, and may be reversibly changed to the non-conduction state and the conduction state also in a case where the voltage having the opposite polarity is applied. A bidirectional diode may be used as the control element 301 having such a property.

b and c of this drawing illustrate a configuration of the reference cell. b of this drawing illustrates an example of the reference cell including a reference element 303 and a variable resistance element 302 connected in series. An element having the same configuration as that of the control element 301 may be used as the reference element 303. Also, the reference cell in c of this drawing illustrates an example of the reference cell including the reference element 303.

[Characteristic of Variable Resistance Element]

Figure 7:
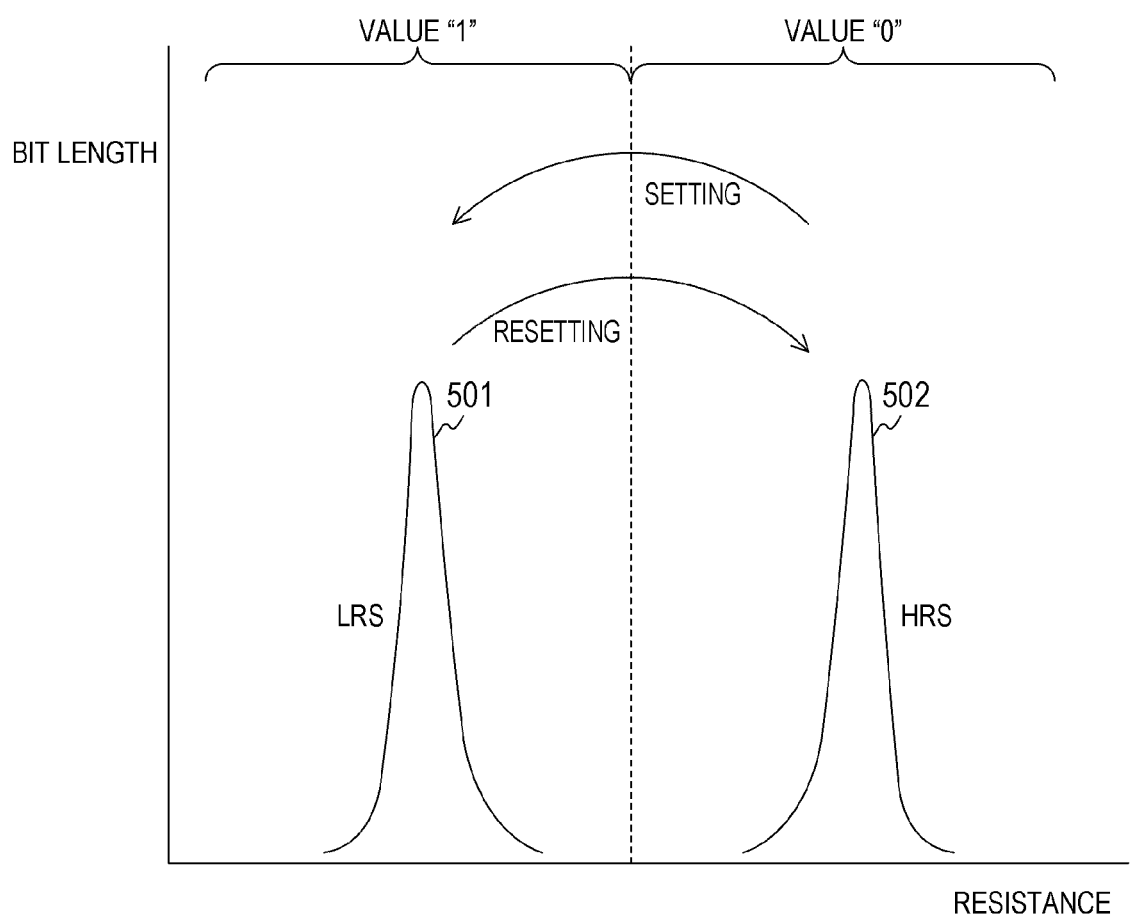
FIG. 7 is a view illustrating an example of a characteristic of a variable resistance element 302 in the first embodiment of the present technology.

FIG. 7 is a view illustrating an example of a characteristic of the variable resistance element 302 in the first embodiment of the present technology. This drawing is a graph representing distribution of resistance values of the variable resistance element 302. In this drawing, a graph 501 represents the distribution in a case of LRS and a graph 502 represents the distribution in a case of HRS. A dotted line found in this drawing indicates a threshold which separates LRS from HRS. It is possible to determine that the variable resistance element 302 is in HRS and LRS in a case where the resistance thereof is higher and lower than the resistance value corresponding to this threshold, respectively. The variable resistance element 302 stores one-bit data by allowing LRS and HRS to correspond to logical values. For example, as illustrated in this drawing, LRS and HRS may correspond to values "1" and "0", respectively. For example, it is also possible to allow LRS and HRS to correspond to the values "0" and "1", respectively. In the embodiment of the present technology, it is assumed that LRS and HRS are allowed to correspond to the values "1" and "0", respectively.

Also, processing of allowing transition from HRS to LRS is referred to as setting, and processing of allowing transition from LRS to HRS is referred to as resetting. As illustrated in FIG. 5, the polarity of the voltage applied to the variable resistance element 302 is different between the setting and the resetting. Hereinafter, this voltage is referred to as a program voltage. Also, in a case of reading from the variable resistance element 302, it is assumed that the voltage having the same polarity as that of the setting is applied. The array driving unit 311 illustrated in FIG. 4 calculates the resistance value of the variable resistance element 302 from current which flows through the memory cell, and compares this resistance value with the resistance value corresponding to the above-described threshold to perform the data reading at the time of reading. Meanwhile, it is also possible to perform the reading from the variable resistance element 302 by applying a voltage having the same polarity as that of the resetting.

As illustrated in FIG. 3, since the memory cell includes the control element 301 and the variable resistance element 302 connected in series, the voltage applied to the memory cell is divided on the basis of a ratio of resistance of the control element 301 and that of the variable resistance element 302. In a case of performing the processing of setting and resetting the variable resistance element 302, it is required to put the control element 301 into the conduction state and apply the program voltage to the variable resistance element 302. Therefore, it is required to apply the write voltage obtained by adding the threshold voltage of the control element 301 and the program voltage to the memory cell.

As described above, at the time of reading, a voltage lower than the program voltage is applied to the memory cell. In a case where the variable resistance element 302 is in HRS, a higher voltage is divided for the variable resistance element 302 as compared to a case of LRS. Therefore, in order to put the control element 301 into the conduction state, it is required to apply a higher voltage than that of the memory cell in which the variable resistance element 302 is in LRS. Hereinafter, the memory cell in which the variable resistance element 302 is in HRS and the memory cell in which the variable resistance element 302 is in LRS are referred to as a HRS memory cell and an LRS memory cell, respectively. A voltage at which the control element 301 in the LRS memory cell is put into the conduction state and the control element 301 in the HRS memory cell remains in the non-conduction state may be adopted as the read voltage which is a voltage to be applied at the time of reading. That is, this may be made the read voltage which is the applied voltage higher than the threshold voltage for the control element 301 of the LRS memory cell and the applied voltage lower than the threshold voltage for the control element 301 of the HRS memory cell. As a result, in the HRS memory cell, the voltage to be applied to the variable resistance element 302 may be decreased by putting the control element 301 into the non-conduction state at the time of reading.

At the time of reading, since the read voltage having the same polarity as that at the time of setting is applied to the variable resistance element 302, a phenomenon in which a storage state of the variable resistance element 302 gradually changes by the reading, and an error occurs in the reading of the stored data is known. This is, for example, a phenomenon in which the resistance value of the variable resistance element 302 in HRS gradually decreases to be a resistance value close to the threshold which separates HRS from LRS and it becomes impossible to read the stored data; the phenomenon referred to as so-called read disturbance. However, in a case where the voltage to be applied to the variable resistance element 302 in HRS is decreased as described above, the change in the storage state of the variable resistance element 302 decreases, and occurrence of the read disturbance may be prevented. In this manner, in the embodiment of the present technology, only the control element 301 in the LRS memory cell is put into the conduction state at the time of reading.

[Characteristic of Control Element]

Figure 8:
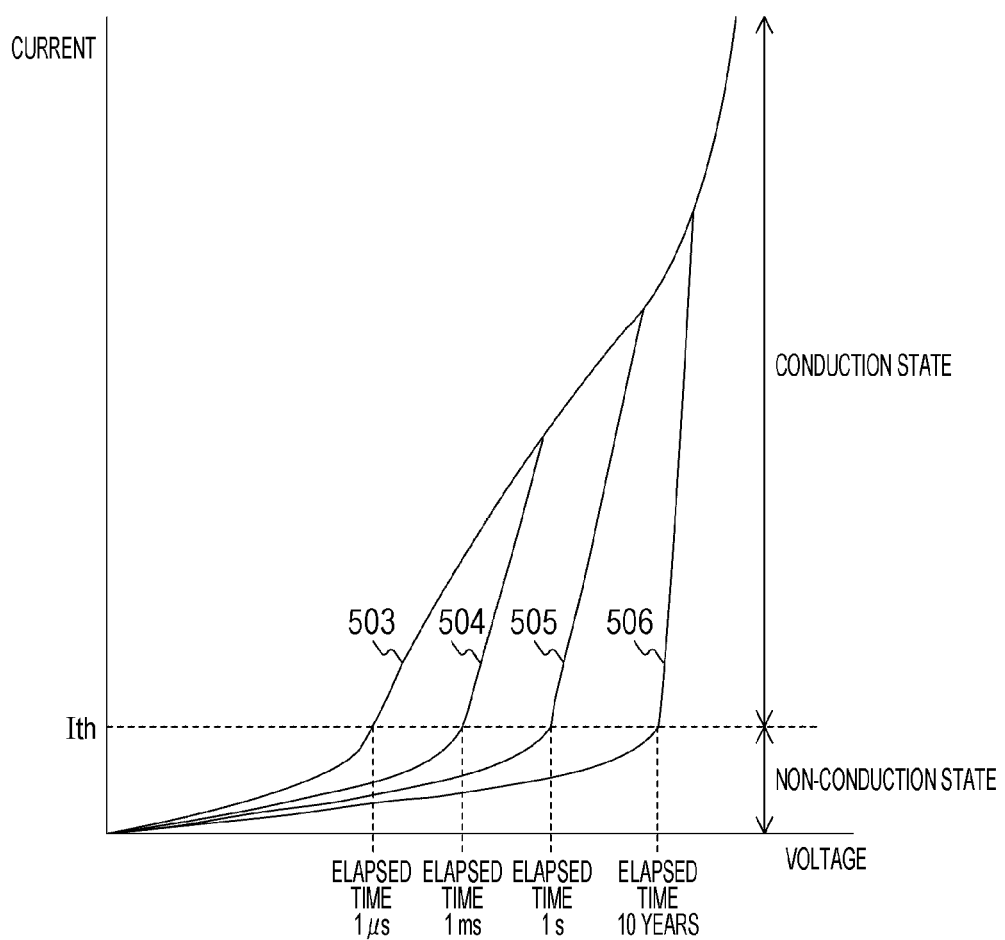
FIG. 8 is a view illustrating an example of a characteristic of a control element 301 in the first embodiment of the present technology.

FIG. 8 is a view illustrating an example of a characteristic of the control element 301 in the first embodiment of the present technology. This drawing is a graph representing a relationship between the applied voltage and the flowing current of the control element 301. As described above, the control element 301 is the bidirectional element, and the characteristic in a case where the voltage having the opposite polarity is applied is equivalent to that in a graph in which only a sign of a characteristic curve in this drawing is made negative. In this drawing, the third quadrant is not illustrated. As illustrated in this drawing, the control element 301 reversibly changes to the non-conduction state and the conduction state. Hereinafter, change from the non-conduction state to the conduction state is referred to as turning-on, and change from the conduction state to the non-conduction state is referred to as turning-off. The threshold voltage is a voltage at which the control element 301 is turned on; for example, a voltage at which the current flowing through the control element 301 reaches Ith being predetermined current illustrated in the drawing may be made the threshold voltage.

The threshold voltage changes in accordance with elapsed time from previous turning-on. A graph 503 in this drawing represents the characteristic in a case where the elapsed time is 1 μs. Similarly, graphs 504 to 506 represent the characteristics in a case where the elapsed time is 1 ms, 1 s, and 10 years, respectively. In this manner, the characteristic curve moves in a direction of a high voltage in this drawing and the threshold voltage also changes to a higher value according to the elapsed time. Therefore, in order to turn on the control element 301, it is necessary to apply a higher voltage as the elapsed time is longer.

By applying a high voltage to the memory cells 314 to 317 as the read voltage assuming a case of long elapsed time, the control element 301 may be turned on regardless of the elapsed time. However, in a case where the high voltage is applied, a case where the control element 301 in the HRS memory cell is turned on is assumed, and power consumption increases. Although it is also possible to record the elapsed time for each memory cell and estimate the threshold voltage on the basis of the same to apply the voltage, a load of hardware and software for recording the elapsed time is excessive. Therefore, a system in which the reference threshold voltage which is the threshold voltage of the reference element 303 of the reference cell is measured and the voltage is applied to the memory cell at the time of access to the memory cell while estimating the reference threshold voltage as the threshold voltage of the control element 301 is adopted.

The reference threshold voltage may be measured in the following manner. As illustrated in FIG. 5, change in current flowing through the reference cell is checked while gradually increasing the voltage applied to the reference cell, and the applied voltage to the reference cell when this current reaches Ith is measured as the reference threshold voltage. The array driving unit 391 illustrated in FIG. 5 outputs the values "0" and "1" as the read data to the access control unit 200 in a case where the current flowing through the reference cell 394 and the like is smaller than Ith and not smaller than Ith, respectively. In a case where the read data has the value "0", the memory access processing unit 240 illustrated in FIG. 4 controls the applied voltage generating unit 250 to output a higher voltage gradually. This control is performed by outputting the control code to the applied voltage generating unit 250. Then, the output voltage of the applied voltage generating unit 250 when the read data has the value "1" is made the reference threshold voltage, and the control code corresponding to the output voltage is held. Next, at the time of reading the data, the voltage based on the control code is estimated to be the threshold voltage of the memory cell 314 and the like to determine the voltage applied to the memory cell 314 and the like. A voltage obtained by adding a predetermined voltage as a margin to the measured reference threshold voltage may also be applied to the memory cell 314 and the like. As a result, even in a case where the characteristics of the control element 301 and the reference element 303 vary widely, the control element 301 may be made sufficiently conductive.

Meanwhile, in order to estimate the reference threshold voltage to be the threshold voltage of the control element 301, it is required to make the elapsed time in the control elements 301 in all the memory cells in the page and the reference elements 303 the same. In the embodiment of the present technology, the reference element 303 and the control element 301 of the LRS memory cell are turned on substantially at the same time at the time of data reading. Also, as described later, in the first embodiment of the present technology, reading (prereading) is performed before the writing in the page. By this prereading, the reference element 303 and the control element 301 of the LRS memory cell are turned on substantially at the same time. The control element 301 of the memory cell in which the variable resistance element 302 changes from HRS to LRS in subsequent writing is turned on substantially at the same time as the reference element 303 in the prereading because the control element 301 is turned on at the time of writing.

On the other hand, as for the HRS memory cell, a case where the elapsed time is different from that of the reference element 303 is assumed. However, in the HRS memory cell, since the control element 301 maintains in the non-conduction state at the time of data reading as described above, the elapsed time of the control element 301 is substantially the same as or longer than the elapsed time of the reference element 303. Therefore, even in a case where the read voltage based on the threshold voltage estimated by the reference element 303 is applied, the control element 301 of the HRS memory cell is not put into the conduction state and reliability of the stored data does not decrease. In this manner, since the reference element 303 and the control element 301 of the LRS memory cell have substantially the same elapsed time, the reference threshold voltage may be estimated to be the threshold voltage of the control element 301 in the page. Meanwhile, in a case where the reference cell having the configuration in b of FIG. 6 is adopted as the reference cell, it is necessary to put the variable resistance element 302 into LRS to use. This is for turning on the reference element 303 and the control element 301 of the LRS memory cell substantially simultaneously at the time of data reading. In a case where the variable resistance element 302 in an initial state (for example, immediately after manufacture) is in HRS, the access control unit 200 is required to perform the writing to (setting) the reference cell 314 and the like as initial operation to put the variable resistance element 302 of all the reference cells into LRS.

[Applied Voltages of Row Signal Line and Column Signal Line]

Figure 9:
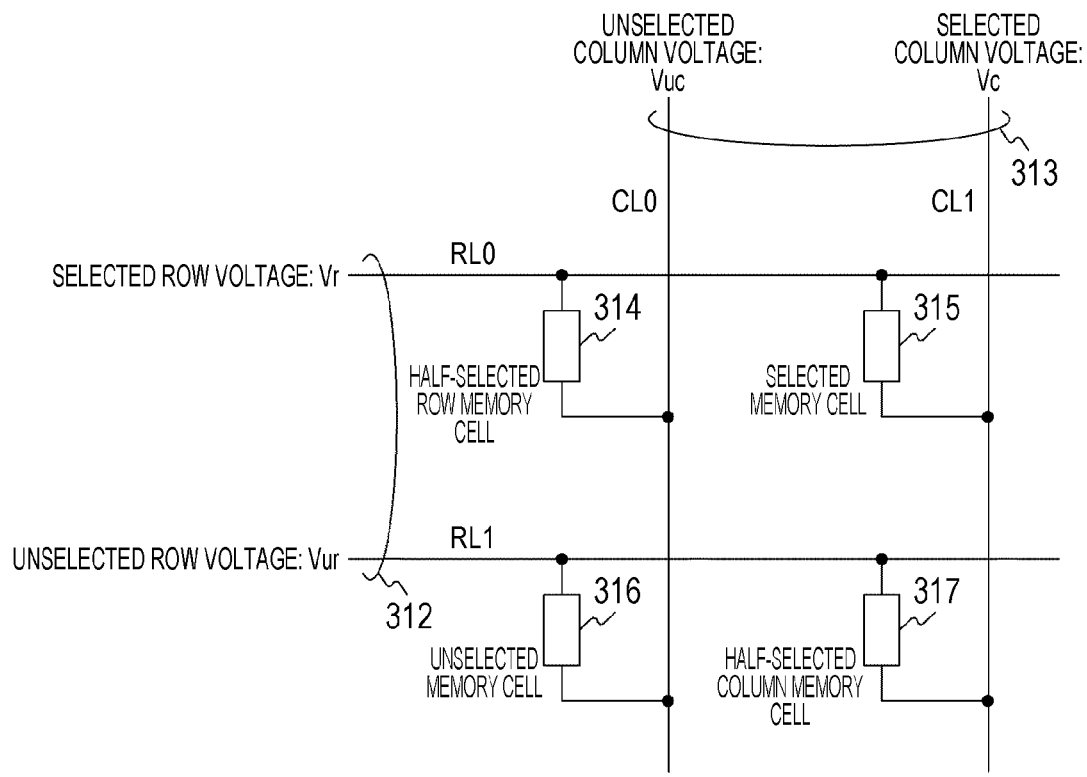
FIG. 9 is a view illustrating applied voltages of a row signal line and a column signal line in the embodiment of the present technology.

FIG. 9 is a view illustrating applied voltages of the row signal line and the column signal line in the embodiment of the present technology. This drawing illustrates a relationship between the voltages applied to the row signal line 312 and the column signal line 313 and the voltage applied to the memory cell 314 and the like in the memory array unit 310 illustrated in FIG. 4. The array driving unit 311 selects the row signal line 312 and the column signal line 313 on the basis of the input address and applies the voltage. In this drawing, a case where the memory cell 315 is accessed is assumed. In this case, the row signal line 312 referred to as "RL0" and the column signal line 313 referred to as "CL1" are selected as the selected row signal line and the selected column signal line, respectively, by the array driving unit 311 and the write voltage and the like is applied thereto. Herein, a selected row voltage Vr and a selected column voltage Vc are applied to the selected row signal line and the selected column signal line, respectively. On the other hand, the row signal line 312 referred to as "RL1" and the column signal line 313 referred to as "CL0" correspond to the unselected row signal line and the unselected column signal line, respectively. The array driving unit 311 applies an unselected row voltage Vur and an unselected column voltage Vuc to the unselected row signal line and the unselected column signal line, respectively.

Herein, the memory cell (memory cell 315) connected to the selected row signal line and the selected column signal line is referred to as a selected memory cell, and the memory cell (memory cell 316) connected to the unselected row signal line and the unselected column signal line is referred to as an unselected memory cell. Also, the memory cell (memory cell 314) connected to the selected row signal line and the unselected column signal line is referred to as a half-selected row memory cell, and the memory cell (memory cell 317) connected to the selected column signal line and the unselected row signal line is referred to as a half-selected column memory cell.

[Applied Voltage of Memory Cell]

FIG. 10 is a view illustrating the applied voltage of the memory cell in the first embodiment of the present technology. a of this drawing illustrates a relationship of the applied voltages between the selected memory cell, and the half-selected row memory cell and the half-selected column memory cell in a case when the writing is performed. A high level write voltage (Vpgm_H) and a low level write voltage (Vpgm_L) are applied as the selected column voltage Vc and the selected row voltage Vr, respectively. As a result, a write voltage (Vpgm) corresponding to a difference voltage thereof is applied to the selected memory cell. On the other hand, a voltage corresponding to a midpoint between Vpgm_H and Vpgm_L is applied as the unselected row voltage Vur and the unselected column voltage Vuc. This voltage is a voltage corresponding to (Vpgm_H+Vpgm_L)/2. As a result, a voltage corresponding to Vpgm/2 is applied to the half-selected row memory cell and the half-selected column memory cell. Herein, it is assumed that the control element 301 of the half-selected row memory cell and the half-selected column memory cell does not turn on in a case where the voltage corresponding to Vpgm/2 is applied. Meanwhile, since the same voltage is applied as the unselected row voltage Vur and the unselected column voltage Vuc, the applied voltage of the unselected memory cell becomes 0 V (not illustrated).

It is also possible to put the unselected row signal line and the unselected column signal line into a floating state and apply the write voltage to the selected row signal line and the selected column signal line. However, in this case, the voltage applied to the half-selected row memory cell and the half-selected column memory cell varies according to the storage state of the variable resistance element 302 of each memory cell. As a result, a voltage higher than the threshold voltage is applied to the half-selected row memory cell and the like, and the control element 301 is turned on, so that there is a possibility that the storage state of the variable resistance element 302 of the half-selected row memory cell and the like is affected. On the other hand, as described above, the array driving unit 311 applies the unselected row voltage Vur and the unselected column voltage Vuc to the unselected row signal line and the unselected column signal line, respectively, so that it is possible to prevent the control element 301 of the half-selected row memory cell and the like from changing to the conduction state.

b of this drawing illustrates a relationship of the applied voltages between the selected memory cell, and the half-selected row memory cell and the half-selected column memory cell in a case where the reading is performed. A high level read voltage (Vsns_H) and a low level read voltage (Vsns_L) are applied as the selected column voltage Vc and the selected row voltage Vr, respectively. As a result, a read voltage (Vsns) corresponding to a difference voltage thereof is applied to the selected memory cell. On the other hand, a voltage corresponding to (Vsns_H+Vsns_L)/2 is applied to the unselected row voltage Vur and the unselected column voltage Vuc.

[Operation Code]

FIG. 11 is a view illustrating the operation code in the first embodiment of the present technology. This drawing illustrates a relationship of the operation code, the enable signal, and the applied voltage to the memory cell. The operation code represents an instruction to the memory array unit 310 for the writing (setting and resetting) and the reading, and may be represented by, for example, a two-bit value.

When the operation code has a value "2b01" and the enable signal has a value "1", the memory array unit 310 performs setting. In this case, as illustrated in FIG. 9, Vpgm_H and Vpgm_L are applied as the selected column voltage Vc and the selected row voltage Vr, respectively. Also, (Vpgm_H+Vpgm_L)/2 is applied as the unselected column voltage Vuc and the unselected row voltage Vur. As a result, the write voltage of Vpgm is applied to the selected memory cell on the basis of the selected row signal line, and the variable resistance element 302 of the memory cell changes from HRS to LRS. Meanwhile, in the memory cell in which the variable resistance element 302 is in LRS, this LRS is maintained. A voltage of Vpgm/2 is applied to the half-selected row memory cell and the half-selected column memory cell. On the other hand, the applied voltage of the unselected memory cell is 0 V.

When the operation code has a value "2b10" and the enable signal has the value "1", the memory array unit 310 performs resetting. In this case, Vpgm_L and Vpgm_H are applied as the selected column voltage Vc and the selected row voltage Vr, respectively. As a result, a write voltage of −Vpgm is applied to the selected memory cell on the basis of the selected row signal line, and the variable resistance element 302 of the memory cell changes from LRS to HRS. Meanwhile, in the memory cell in which the variable resistance element 302 is in HRS, this HRS is maintained.

When the operation code has a value "2b11" and the enable signal has the value "1", the memory array unit 310 performs reading. In this case, Vsns_H and Vsns_L are applied as the selected column voltage Vc and the selected row voltage Vr, respectively. As a result, a read voltage of Vsns is applied to the selected memory cell on the basis of the selected row signal line. In this case, HRS and LRS of the variable resistance element 302 of the memory cell do not change and are maintained.

When the operation code has a value "2b00" or the enable signal has a value "0", the memory array unit 310 is put into a so-called no operation state. In this case, (Vsns_H+Vsns_L)/2 is applied as the selected column voltage Vc, the selected row voltage Vr, the unselected column voltage Vuc, and the unselected row voltage Vur.

The operation codes are generated by the memory access processing unit 240 to be held in the operation code holding unit 230. Since the operation code is the two-bit value and the number of the memory array units and the reference array unit is nine, a size of the operation code holding unit 230 is of 18 bits. Herein, the operation code at the time of writing may be generated by the following procedure. First, the memory access processing unit 240 holds the write data in the write data holding unit 210. Next, the memory access processing unit 240 holds preread data which is the data read by prereading in the read data holding unit 220. Next, the memory access processing unit 240 generates a corresponding operation code on the basis of the value of each bit of the preread data and the write data, and holds the same in the operation code holding unit 230.

The operation code may be generated on the basis of following expressions.

(R[n], W[n])=(0, 1); operation code=2b01 (setting)
(R[n], W[n])=(1, 0); operation code=2b10 (resetting)
(R[n], W[n])=(0, 0); operation code=2b00 (no operation)
(R[n], W[n])=(1, 1); operation code=2b00 (no operation)

In which, R[n] represents an n-th bit value in the preread data. Also, n represents a natural number. Also, W[n] represents an n-th bit value in the write data.

Meanwhile, the operation code illustrated in this drawing may also be used in the reference array unit 390. However, at the time of reading and no operation, Vref_H and Vref_L are applied in place of Vsns_H and Vsns_L in thisis drawing, respectively. A relationship between Vsns_H and the like and Vref_H and the like is to be described later.

The voltage such as Vpgm_H described above is generated by the applied voltage generating unit 250 illustrated in FIG. 2.

[Output Voltage of Applied Voltage Generating Unit]

Figure 12:
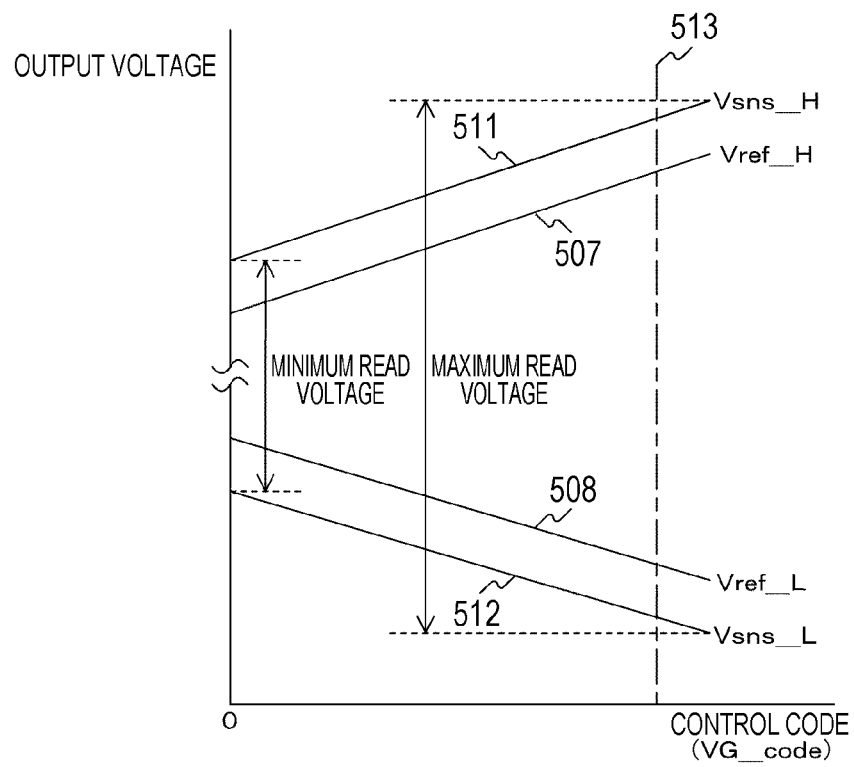
FIG. 12 is a view illustrating an output voltage of an applied voltage generating unit 250 in the first embodiment of the present technology.

FIG. 12 is a view illustrating the output voltage of the applied voltage generating unit 250 in the first embodiment of the present technology. This drawing illustrates a relationship between the output voltage of the applied voltage generating unit 250 and the control code output by the memory access processing unit 240. A graph 507 in this drawing is a graph representing a relationship between the control code and Vref_H. A graph 508 is a graph representing a relationship between the control code and Vref_L. A graph 511 is a graph representing a relationship between the control code and Vsns_H. A graph 512 is a graph representing a relationship between the control code and Vsns_L. The control code is represented by a natural number including zero. In a case where the control code has a value "0", Vref_H and Vsns_H become the lowest voltages, and Vref_L and Vsns_L become the highest voltages. Vref_H and Vsns_H increase and Vref_L and Vsns_L decrease in proportion to the control code. That is, as the control code increases, the voltages applied to the reference cell and the memory cell increase. Also, in a case where the control codes are the same, Vsns_H is higher than Vref_H by a voltage corresponding to the margin, and Vsns_L is lower than Vref_L by a voltage corresponding to the margin.

When the control code has the value "0", a minimum read voltage is applied to the memory cell, and when the control code has the maximum value, a maximum read voltage is applied to the memory cell. By setting a predetermined threshold to this control code, a maximum value of the voltage applied to the memory cell and the like may be changed. A dashed-dotted line 513 in the drawing indicates an example of this threshold.

[Read Processing]

Figure 13:
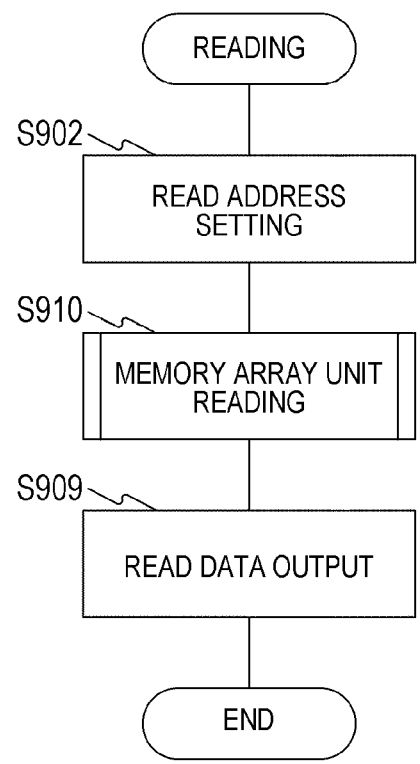
FIG. 13 is a view illustrating an example of a procedure of read processing in the first embodiment of the present technology.

FIG. 13 is a view illustrating an example of a procedure of read processing in the first embodiment of the present technology. The processing in this drawing is executed when the read request is input through the memory controller interface 100. First, the memory access processing unit 240 interprets the read request, sets the read destination address, and outputs the same to the memory array 300 (step S902). Next, the memory access processing unit 240 performs memory array unit read processing (step S910). As a result, reading from the memory array units #1 (310) to #8 (380) is performed. Finally, the memory access processing unit 240 outputs the read data to the memory controller 20 (step S909), and ends the read processing.

[Memory Array Unit Read processing]

Figure 14:
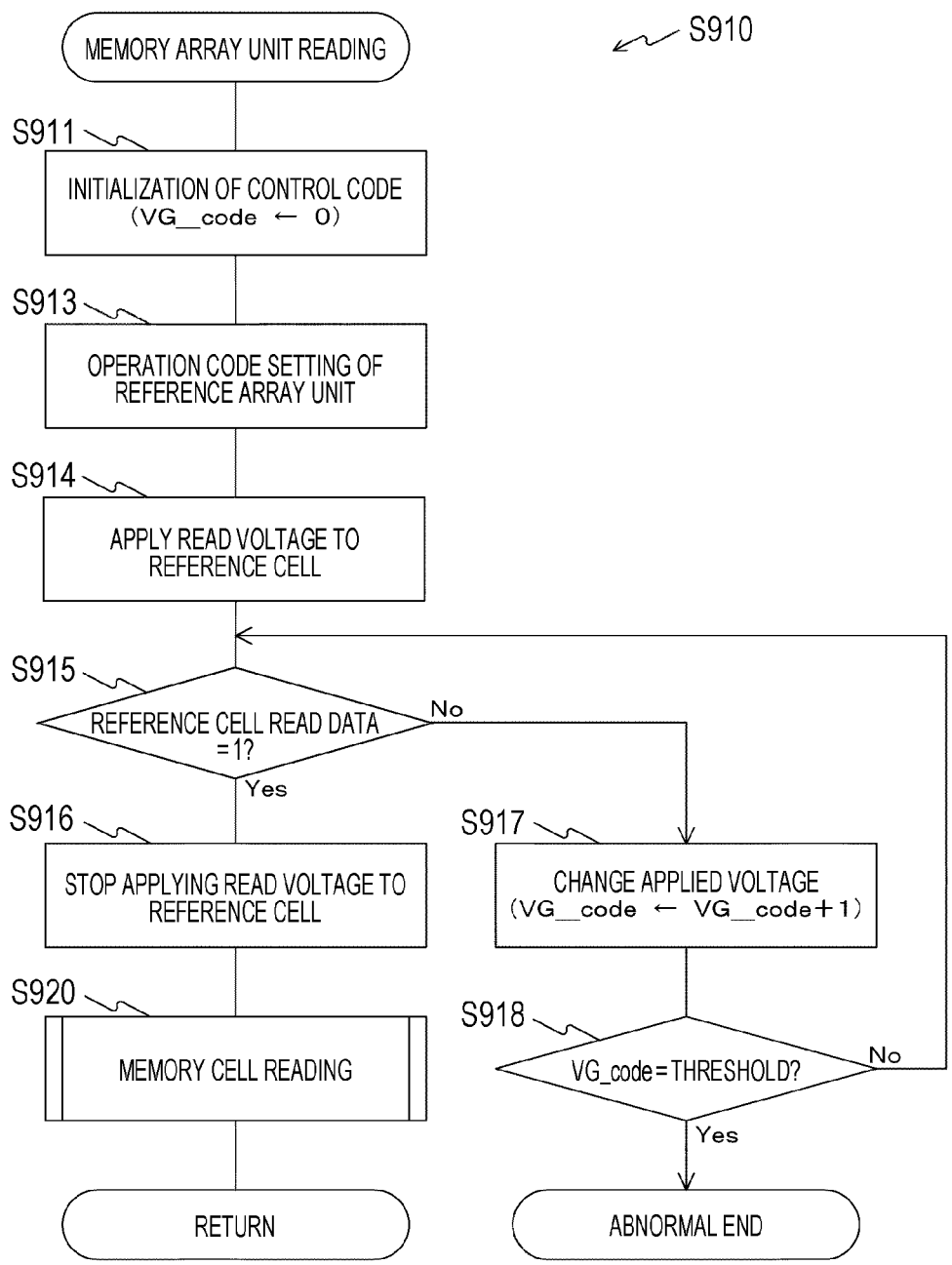
FIG. 14 is a view illustrating an example of a procedure of memory array unit read processing (step S910) in the first embodiment of the present technology.

FIG. 14 is a view illustrating an example of a procedure of the memory array unit read processing (step S910) in the first embodiment of the present technology. This drawing illustrates the memory array unit read processing (step S910) illustrated in FIG. 13. First, the memory access processing unit 240 initializes a control code VG_code to 0 (step S911). Next, the memory access processing unit 240 sets the operation code of the reference array unit 390 (step S913). This may be performed by allowing the operation code holding unit 230 to hold the value "2b11" as the operation code of the reference array unit 390. Next, the memory access processing unit 240 sets the enable signal of the reference array unit 390 to the value "1" and applies the read voltage to the reference cell 394 and the like (step S914). As a result, Vref_H and Vref_L are applied to the reference cell 394 and the like. Next, the memory access processing unit 240 determines whether the read data of the reference cell 394 and the like is the value "1" (step S915).

In a case where the read data of the reference cell 394 and the like is not the value "1" (step S915: No), the memory access processing unit 240 increments the control code VG_code and changes the applied voltage of the reference cell 394 and the like (step S917). As a result, in a case where the control code VG_code reaches the threshold illustrated in FIG. 12 (step S918: Yes), the memory access processing unit 240 abnormally ends the memory array unit read processing without returning to the original read processing. In this case, the memory access processing unit 240 determines that an abnormality occurs in the reference cell 394 and the like and may output a fact that the reading fails to the memory controller 20. On the other hand, in a case where the control code VG_code does not reach the threshold (step S918: No), the memory access processing unit 240 executes the processing at step S915 again.

At step S915, in a case where the read data of the reference cell 394 and the like is the value "1" (step S915: Yes), the memory access processing unit 240 stops applying the read voltage to the reference cell 394 and the like (step S916). This may be performed by setting the enable signal of the reference array unit 390 to the value "0". The reference threshold voltage is measured by the processing, and the control code VG_code is held by the memory access processing unit 240 as a result of the measurement. Next, the memory access processing unit 240 performs the data reading by memory cell read processing (step S920), and ends the memory array unit read processing.

[Memory Cell Read Processing]

Figure 15:
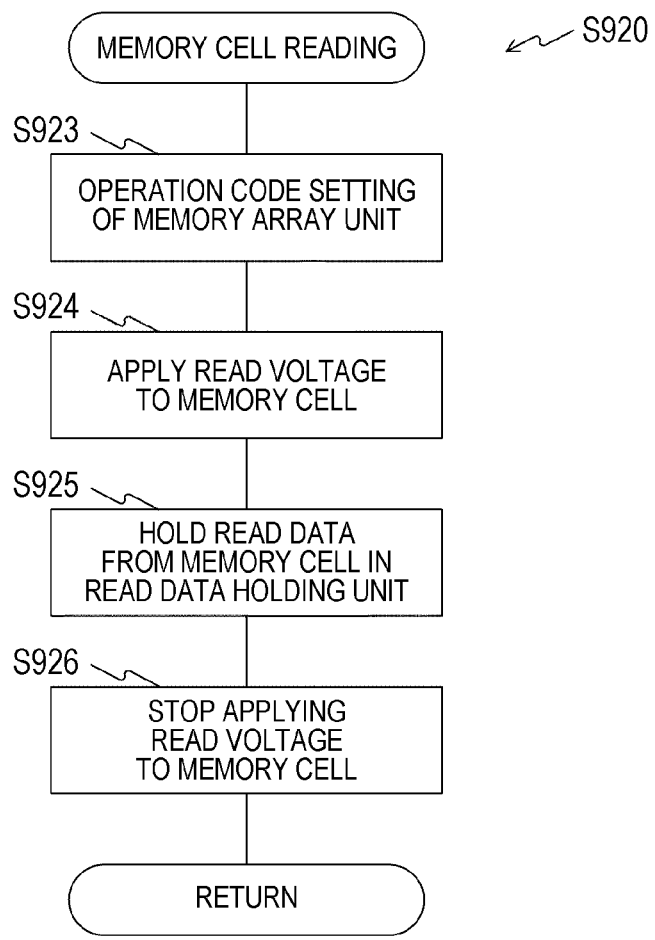
FIG. 15 is a view illustrating an example of a procedure of memory cell read processing (step S920) in the first embodiment of the present technology.

FIG. 15 is a view illustrating an example of a procedure of the memory cell read processing (step S920) in the first embodiment of the present technology. This illustrates the memory cell read processing (step S920) illustrated in FIG. 14. First, the memory access processing unit 240 sets the operation code of the memory array unit #1 (310) and the like (step S923). This may be performed by allowing the operation code holding unit 230 to hold the value "2b11" as the operation code of the memory array units #1 (310) to #8 (380).

Next, the memory access processing unit 240 sets the enable signal of the memory array unit #1 (310) and the like to the value "1" and applies the read voltage to the memory cell (step S924). As a result, Vsns_H and Vsns_L are applied to the memory cell. Next, the memory access processing unit 240 holds the read data output from the memory array unit #1 (310) and the like in the read data holding unit 220 (step S925). Finally, the memory access processing unit 240 sets the enable signal of the memory array unit #1 (310) and the like to the value "0", stops applying the read voltage to the memory cell (step S926), and ends the memory cell read processing. By this processing, the read voltage obtained by estimating the reference threshold voltage to be the threshold voltage of the control element 301 of the memory cell is applied to the memory cell 314 and the like, and the data reading is performed.

[Write Processing]

Figure 16:
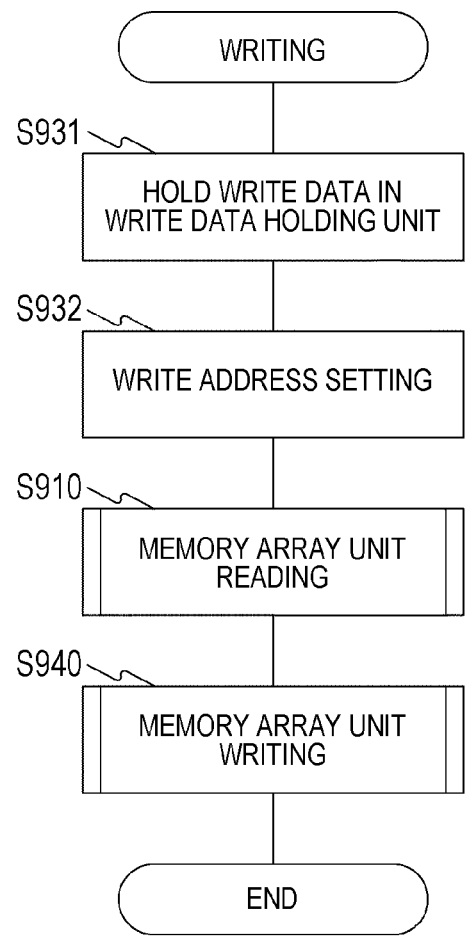
FIG. 16 is a view illustrating an example of a procedure of write processing in the first embodiment of the present technology.

FIG. 16 is a view illustrating an example of a procedure of write processing in the first embodiment of the present technology. The processing in this drawing is executed when the write request is input through the memory controller interface 100. First, the memory access processing unit 240 interprets the write request and holds the write data in the write data holding unit 210 (step S931). Next, the memory access processing unit 240 sets the write destination address and outputs the same to the memory array 300 (step S932). Next, the memory access processing unit 240 performs the memory array unit read processing (step S910). This processing corresponds to the prereading, and the memory access processing unit 240 executes the processing at step S910 illustrated in FIG. 14. Next, the memory access processing unit 240 performs memory array unit write processing (step S940). As a result, writing to the memory array units #1 (310) to #8 (380) is performed. Thereafter, the memory access processing unit 240 ends the write processing.

[Memory Array Unit Write Processing]

Figure 17:
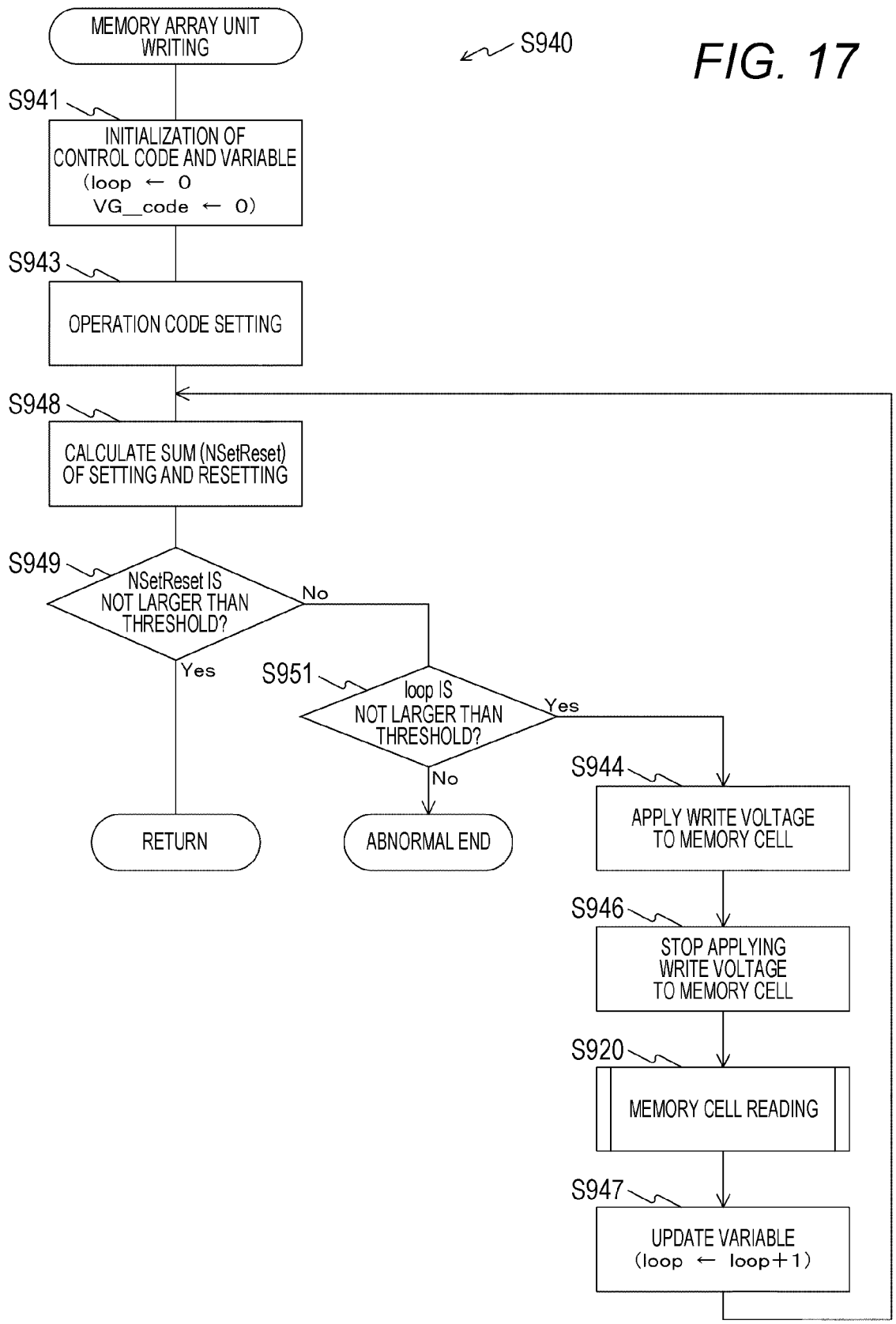
FIG. 17 is a view illustrating an example of a procedure of memory array unit write processing (step S940) in the first embodiment of the present technology.

FIG. 17 is a view illustrating an example of a procedure of the memory array unit write processing (step S940) in the first embodiment of the present technology. This illustrates the memory array unit write processing (step S940) illustrated in FIG. 16. First, the memory access processing unit 240 initializes a variable loop and the control code VG_code to a value "0" (step S941). Next, the memory access processing unit 240 sets the operation codes of the memory array units #1 (310) to #8 (380) (step S943). This may be performed by setting the operation code of the memory array unit #1 (310) and the like on the basis of the preread data and the write data and allowing the operation code holding unit 230 to hold the same. Next, the memory access processing unit 240 calculates the sum (NSetReset) of the operation code issuing an instruction to set and the operation code issuing an instruction to reset from the held operation codes (step S948).

In a case where NSetReset is equal to or smaller than a predetermined threshold (step S949: Yes), the memory access processing unit 240 determines that the writing is successful and ends the memory array unit write processing. This is because, even in a case where NSetReset is not 0, that is, in a case where the write data and the read data do not completely coincide with each other, the error detecting/correcting unit 23 of the memory controller 20 may correct the error.

On the other hand, in a case where NSetReset is larger than the predetermined threshold (step S949: No), the memory access processing unit 240 determines whether the variable loop is not larger than a predetermined threshold (step S951). In a case where the variable loop reaches the predetermined threshold (step S951: No), the memory access processing unit 240 abnormally ends the memory array unit write processing without returning to the original write processing. In this case, the memory access processing unit 240 may output a fact that the writing fails to the memory controller 20.

On the other hand, in a case where the variable loop is not larger than the predetermined threshold (step S951: Yes), the memory access processing unit 240 sets the enable signal of the memory array unit #1 (310) and the like to the value "1" and applies the write voltage to the memory cell (step S944). After predetermined writing time elapses, the memory access processing unit 240 sets the enable signal of the memory array unit #1 (310) and the like to the value "0" and stops applying the write voltage to the memory cell (step S946). Next, the memory access processing unit 240 performs the memory cell read processing (step S920). This is the processing of reading the data for performing verification to determine whether the writing is performed correctly, the processing of making the read data new preread data. The memory access processing unit 240 executes the processing at step S920 illustrated in FIG. 15. Next, the memory access processing unit 240 increments the variable loop to update (step S947), and shifts to the processing at step S948.

In a case where it is reset at step S944, the control element 301 of the HRS memory cell is turned on, and in the memory cell reading immediately after this (step S920: verification), the reference element 303 of the reference cell is turned on. Furthermore, also in the write processing (FIG. 16) which is a caller of the memory array unit write processing (step S940), the reference element 303 is turned on in the memory array unit reading (step S910: prereading). In this manner, since the reference element 303 is turned on substantially at the same time as turning-on of the control element 301 of the HRS memory cell, the elapsed time of the control element 301 of the HRS memory cell is not shorter than the elapsed time of the reference element 303.

On the other hand, if a system of resetting the HRS memory cell without carrying out any of the above-described verification and prereading in the write processing, there is a case where the elapsed time of the control element 301 of the HRS memory cell becomes shorter than that of the reference element 303. In such a case, if the threshold voltage of the control element 301 of the memory cell is estimated by the reference element 303 and the reading is performed, a relatively high read voltage is applied to the HRS memory cell with short elapsed time and the control element 301 might be put into the conduction state. In the first embodiment of the present technology, it is possible to prevent such turning-on of the control element 301 of the HRS memory cell.

[Relationship Between Applied Voltage and Current of Memory Cell]

Figure 18:
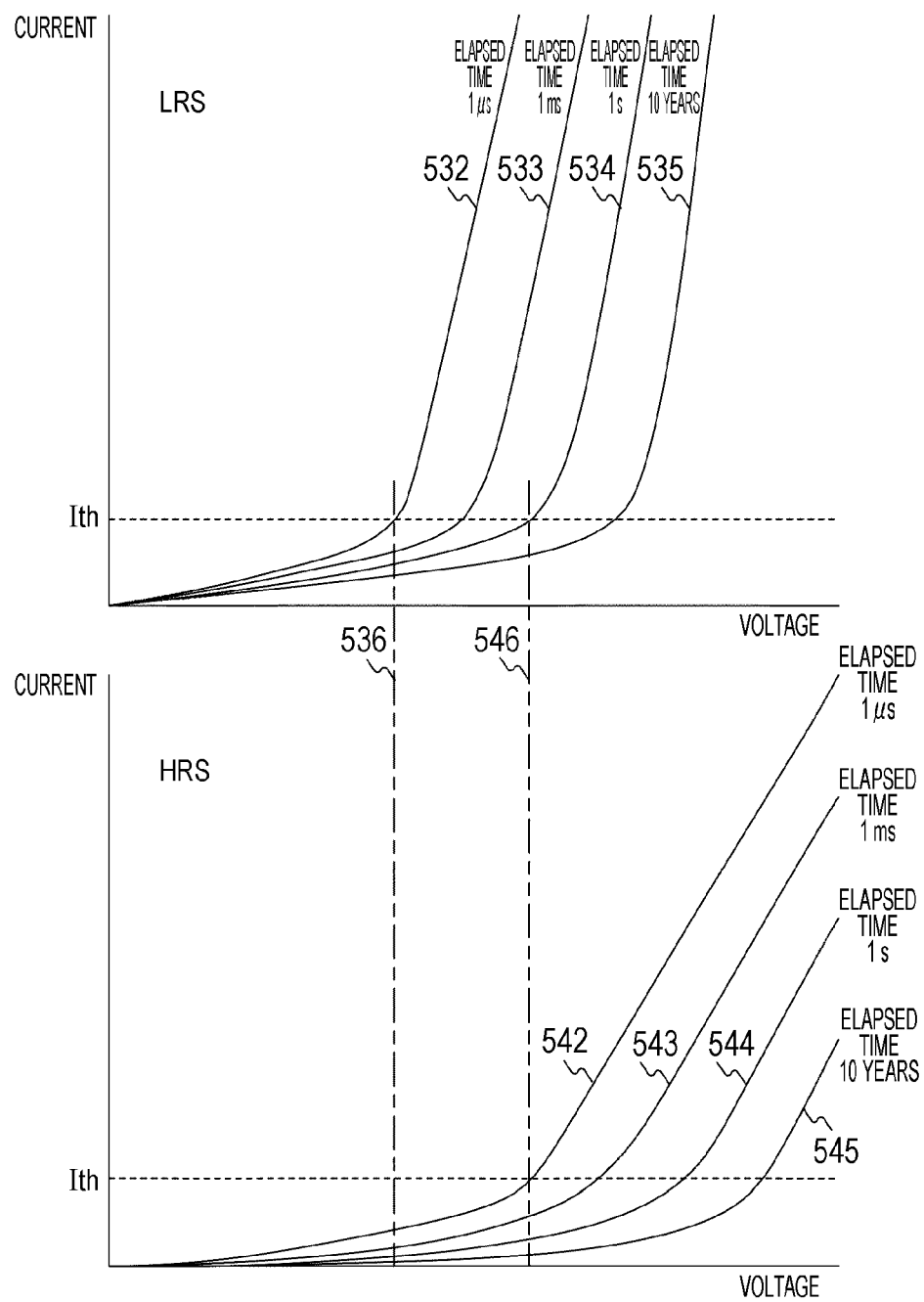
FIG. 18 is a view illustrating a relationship between the applied voltage and current of the memory cell in the first embodiment of the present technology.

FIG. 18 is a view illustrating a relationship between the applied voltage and the current of the memory cell in the first embodiment of the present technology. This drawing illustrates the relationship between the applied voltage and the current for each elapsed time for the LRS memory cell and the HRS memory cell. In the drawing, an upper side illustrates a case of LRS and a lower side illustrates a case of HRS. Also, a dotted line in this drawing indicates a current value (Ith) for determining the threshold voltage. Graphs 532 and 542 in this drawing represent characteristics in a case where the elapsed time is 1 μs, graphs 533 and 543 represent characteristics in a case where the elapsed time is 1 ms, and graphs 534 and 544 represent characteristics in a case where the elapsed time is 1 s. Also, graphs 535 and 545 in this drawing represent characteristics in a case where the elapsed time is 10 years.

A characteristic curve in this drawing is separated into a region in which the control element 301 is in the non-conduction state and a region in which this is in the conduction state with Ith as a boundary. Furthermore, in the conduction state, the variable resistance element 302 has different characteristics depending on whether this is in LRS or HRS. Also, the threshold of the control element 301 changes depending on the elapsed time. Therefore, in the first embodiment of the present technology, the reference element 303 is arranged, and the elapsed time of the reference element 303 is made substantially the same as the elapsed time of the LRS memory cell and not longer than the elapsed time of the HRS memory cell. Then, the threshold voltage of the memory cell is estimated by the reference threshold voltage of the reference element 303 and the voltage is applied to the memory cell, thereby performing the reading. A dashed-dotted line 536 in this drawing indicates the threshold voltage in a case where the elapsed time is 1 μs in the LRS memory cell, and a dashed-two dotted line 546 indicates the threshold voltage in a case where the elapsed time is 1 μs in the HRS memory cell. In a case where the elapsed time is equal in this manner, the threshold voltage of the LRS memory cell is different from that of the HRS memory cell. Therefore, for example, the reading may be performed by applying an intermediate voltage of the threshold voltages indicated by the dashed-dotted line 536 and the dashed-two dotted line 546 as the read voltage. In this case, the control element 301 of the LRS memory cell is put into the conduction state and the control element 301 of the HRS memory cell maintains the non-conduction state.

As a result, even in a case where the threshold voltage of the control element changes, the control element 301 of the memory cell may be made sufficiently conductive. It becomes possible to read the same data as the written data, and it is possible to improve the reliability of the stored data. Also, since it is not necessary to apply a high voltage taking into consideration of the change in threshold voltage at the time of reading, relatively low power consumption may be realized. Furthermore, in the first embodiment of the present technology, it is possible to prevent the control element 301 of the HRS memory cell from being put into the conduction state at the time of reading. As a result, the voltage applied to the variable resistance element 302 of the HRS memory cell may be decreased, and occurrence of read disturbance may be prevented, thereby improving the reliability of the stored data.

As described above, in the first embodiment of the present technology, in a case where the threshold of the control element 301 in the memory cell changes, the threshold voltage of the control element 301 is estimated by the reference threshold voltage of the reference element 303, and the voltage is applied to the memory cell to perform the reading. As a result, even in a case where the threshold of the control element 301 changes, the same data as the written data may be read, and the reliability of the stored data may be improved.

[First Variation]

In the first embodiment described above, the reference cells 394 and the like are arranged in array like the memory cells, and one reference cell is selected by the selected row signal line and the selected column signal line. On the other hand, a system in which one of a plurality of reference cells 394 and the like is selected on the basis of an address by a selector and the like may also be adopted. This is because it is possible to estimate a threshold voltage of a memory cell by a reference threshold voltage when a memory cell based on the address and the reference cell corresponding thereto are selected.

[Second Variation]

In the first embodiment described above, the processing regarding the measurement of the reference threshold voltage and the processing regarding the reading from the memory cell are sequentially executed at the time of reading. That is, in the memory array unit read processing (step S910) illustrated in FIG. 14, the processing from step S912 to step S918 and the processing at step S920 are sequentially executed. In contrast, in a case where the read processing is continuously performed, these pieces of processing may be performed simultaneously in parallel, that is, executed in a form of pipeline processing. As a result, it is possible to shorten time required for reading over a plurality of addresses.

[Third Variation]

In the first embodiment described above, the operation code of the memory cell is set on the basis of the preread data and the write data at the time of writing; however, it is also possible to set the operation code on the basis of only the write data to perform writing. Specifically, a value "2b10" (resetting) is set as the operation code for a bit in which the write data is a value "0", and a value "2b01" (setting) is set as the operation code for a bit in which the write data is a value "1" and the writing is performed. Prereading may be omitted, and write processing may be simplified. In this case, in a case where there is a HRS memory cell in a page after the write processing, it is necessary to turn on a control element 301 in an LRS memory cell in the page and a reference element 303 of a corresponding reference cell. This is for setting elapsed time in the control element 301 of the memory cell and the reference element 303 to be substantially the same or shorter so as to estimate a threshold voltage of the memory cell by a reference threshold voltage.

[Fourth Variation]

In the first embodiment described above, the error detection and the error correction on the read data are performed, but a control element 301 of a memory cell and the like may be turned on the basis of a result of the error detection and error correction. In a ReRAM, a phenomenon is known in which current flowing at the time of reading significantly fluctuates due to an influence of noise (random telegraph noise: RTN). Due to the RTN, there is a case in which the control element 301 erroneously operates, and data different from data stored in a variable resistance element 302 is output to a memory controller 20 as read data. The erroneous operation of the control element 301 due to the RTN may be determined by whether the error is corrected by an error detecting/correcting unit 23.

For example, in a case where there is a bit a value of which is corrected from "0" to "1", it may be determined that the control element 301 did not turn on due to the influence of the RTN in the memory cell corresponding to this bit. That is, it may be determined that an array driving unit 311 determines that the memory cell is in HRS even though this is an LRS memory cell and a value "0" is read. In this case, by reading this page again, elapsed time of the control element 301 in the LRS memory cell and that of a reference element 303 may be made substantially the same. Also, for example, in a case where there is a bit a value of which is corrected from "1" to "0", it may be determined that the control element 301 of the HRS memory cell changes to a conduction state due to the influence of the RTN in the memory cell corresponding to the bit. In this case, by turning on the reference element 303, the elapsed time of the control element 301 in the HRS memory cell and that of the reference element 303 may be made substantially the same.

In this manner, even in a case where the control element 301 erroneously operates due to the influence of the RTN and the like, by turning on the control element 301 and the reference element 303 on the basis of the result of the error detection and the error correction, reliability of stored data may be improved.

2. Second Embodiment

In the first embodiment described above, at the time of reading, the reference threshold voltage is always measured, and the threshold voltage of the control element 301 of the memory cell is estimated. On the other hand, in a second embodiment of the present technology, measurement of a reference threshold voltage and the like is performed on the basis of a result of error detection and error correction in read data. This shortens time required for reading.

[Read Processing]

Read processing in the second embodiment of the present technology is performed by the following procedure. First, a memory access processing unit 240 performs reading on the basis of a read request issued by a memory controller 20. At that time, the memory access processing unit 240 omits the measurement of the reference threshold voltage and performs the reading from a memory cell. An access control unit 200 outputs a value "0" as a control code to an applied voltage generating unit 250 and allows the same to generate a minimum read voltage to apply to the memory cell. Thereafter, when the read data is output to the memory controller 20, an error detecting/correcting unit 23 performs the error detection and error correction on the read data. In a case where the detected error exceeds a predetermined bit length or the error cannot be corrected, the memory controller 20 issues a second read request. On the basis of the second read request, the access control unit 200 measures the reference threshold voltage and estimates a threshold voltage of a control element 301 of the memory cell by the reference threshold voltage.

In order to perform such processing, the memory access processing unit 240 needs to grasp whether the read request is the second request. This may be performed, for example, when the memory controller 20 notifies the memory access processing unit 240 that this is the second request. As a result, it is possible to estimate the threshold voltage of the control element 301 of the memory cell by measuring the reference threshold voltage as needed, such as in a case where many errors are detected from the read data, thereby reducing time required for the reading. Since configurations of the memory controller 20 and a memory 30 other than this are similar to those of the memory controller 20 and the memory 30 in the first embodiment of the present technology, the description thereof is omitted.

[Memory Array Unit Read Processing]

Figure 19:
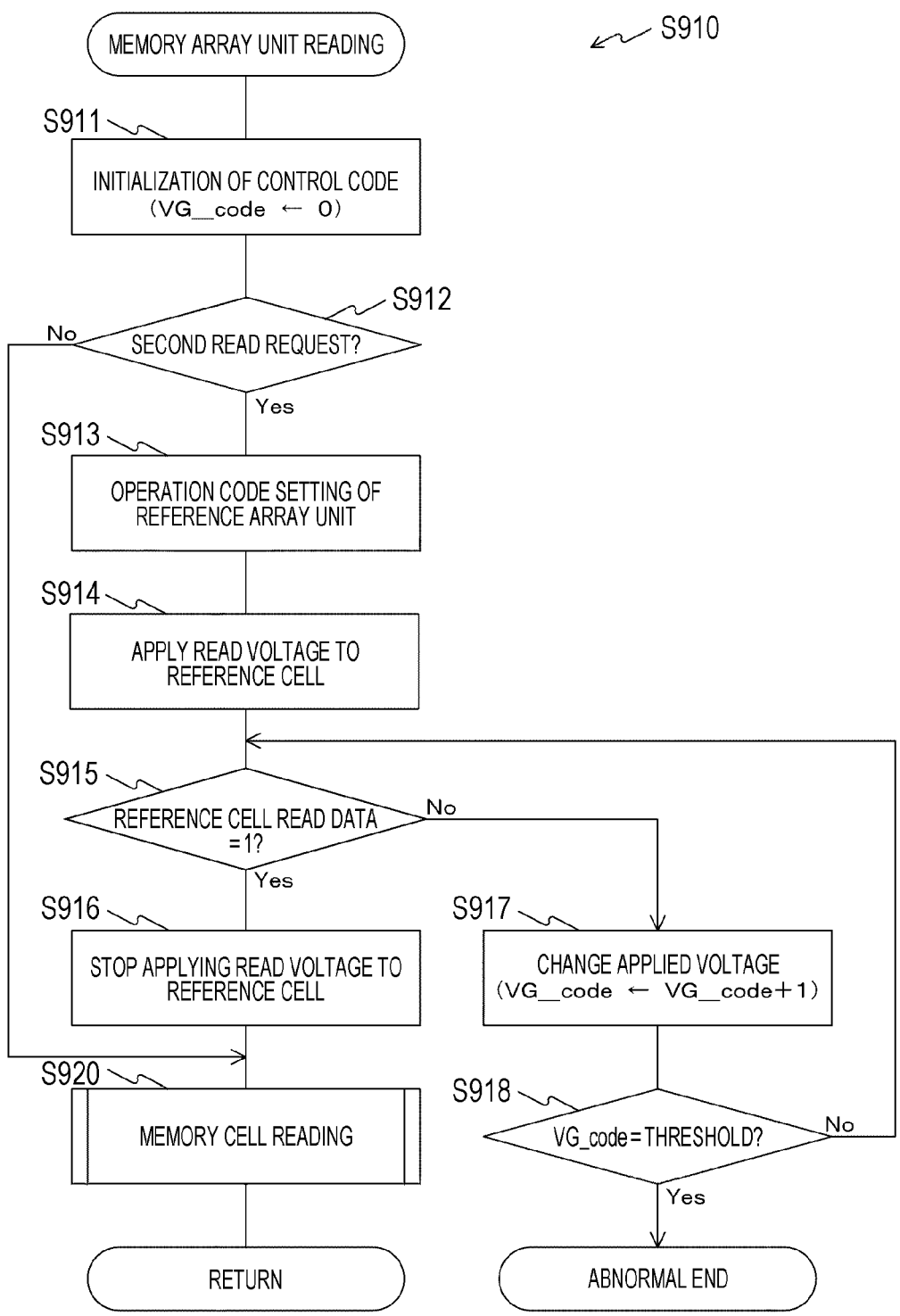
FIG. 19 is a view illustrating an example of a procedure of memory array unit read processing (step S910) in a second embodiment of the present technology.

FIG. 19 is a view illustrating an example of a procedure of memory array unit read processing (step S910) in the second embodiment of the present technology. The processing in this drawing is different from the processing illustrated in FIG. 14 in that step S912 is added between steps S911 and S913. At step S912, the memory access processing unit 240 determines whether the read request is the second read request (step S912). As a result, in a case where this is the second read request (step S912: Yes), the memory access processing unit 240 shifts to processing at step S913. On the other hand, in a case where this is not the second read request (step S912: No), the memory access processing unit 240 skips the processing at steps S913 to S918 and shifts to processing at step S920.

Since read processing and write processing other than this are similar to the read processing and write processing in the first embodiment of the present technology, the description thereof is omitted.

In this manner, according to the second embodiment of the present technology, since the reference threshold voltage is measured and the threshold voltage of the control element 301 in the memory cell is estimated as needed, it is possible to shorten the time required for the reading.

3. Third Embodiment

In the first embodiment described above, one reference element 303 is arranged for each page. On the other hand, in a third embodiment of the present technology, two reference elements 303 are arranged for each page to estimate a threshold voltage of a control element 301 of a memory cell. As a result, even in a case where a characteristic of the reference element 303 varies, reliability of stored data is improved.

[Configuration of Memory Array]

Figure 20:
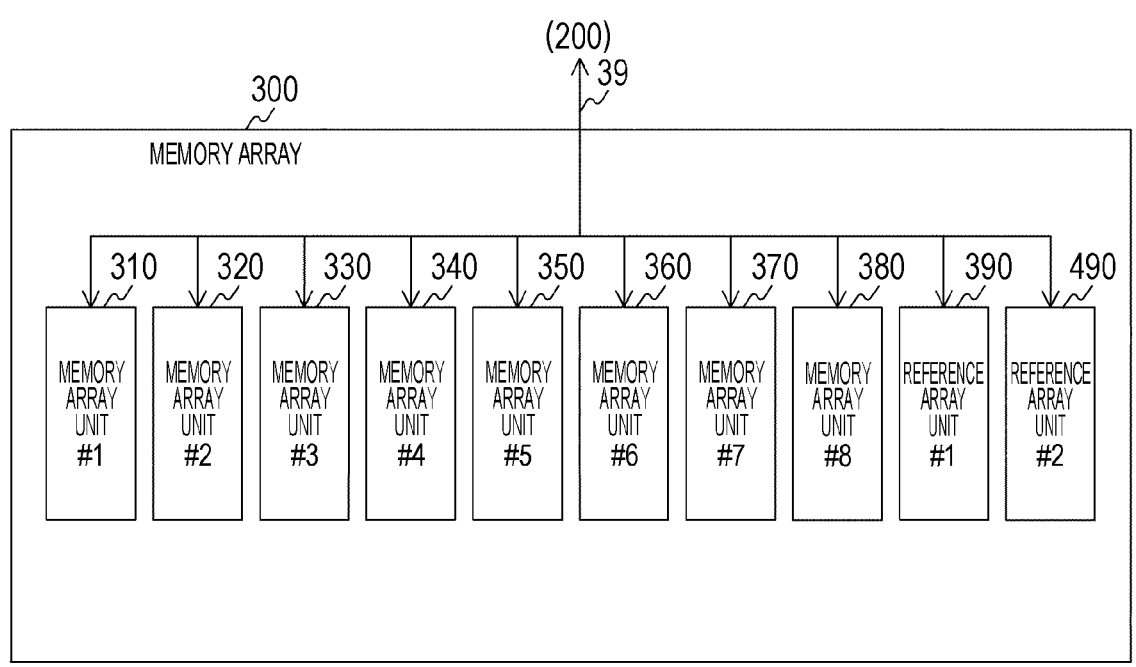
FIG. 20 is a view illustrating a configuration example of a memory 300 in a third embodiment of the present technology.

FIG. 20 is a view illustrating a configuration example of a memory 300 in the third embodiment of the present technology. The memory array 300 is provided with memory array units #1 (310) to #8 (380) and reference array units #1 (390) and #2 (490). The memory array 300 in this drawing is different from the memory array 300 illustrated in FIG. 3 in that this includes two reference array units.

A memory access processing unit 240 in the third embodiment of the present technology measures a reference threshold voltage of each of the reference array units #1 (390) and #2 (490), and estimates the threshold voltage of the control element 301 of the memory cell by the two obtained reference threshold voltages. Specifically, the memory access processing unit 240 individually controls the reference array units #1 (390) and #2 (490) to obtain two control codes VG_code. Thereafter, an applied voltage of the memory cell is set on the basis of an average value of the control codes VG_code. Since a configuration of a memory 30 other than this is similar to the configuration of a memory 30 in the first embodiment of the present technology, the description thereof is omitted.

In this manner, in the third embodiment of the present technology, the threshold voltage of the control element 301 of the memory cell is estimated from the average value of the two reference threshold voltages obtained from the two reference elements 303 and the reading is performed. This makes it possible to improve reliability of stored data even in a case where characteristics of the reference element vary.

[Variation]

Although the two reference elements 303 are arranged for each page in the above-described third embodiment, three or more reference elements 303 may also be arranged. This is because it becomes possible to more accurately estimate the threshold voltage by using the average value of many reference threshold voltages. Meanwhile, at that time, it is also possible to estimate the threshold voltage by using a mode value of the reference threshold voltages in place of the average value of the reference threshold voltages.

4. Fourth Embodiment

In the first embodiment described above, the threshold voltage of the control element 301 of the selected memory cell is estimated by the reference threshold voltage. On the other hand, in a fifth embodiment of the present technology, a threshold voltage of a control element 301 of a half-selected row memory cell and that of a half-selected column memory cell at the time of writing are estimated and voltages are applied to the half-selected row memory cell and the half-selected column memory cell. As a result, change of the control element 301 of the half-selected row memory cell and the like to a conduction state at the time of writing is prevented, and reliability of stored data is improved.

[Configuration of Access Control Unit]

Figure 21:
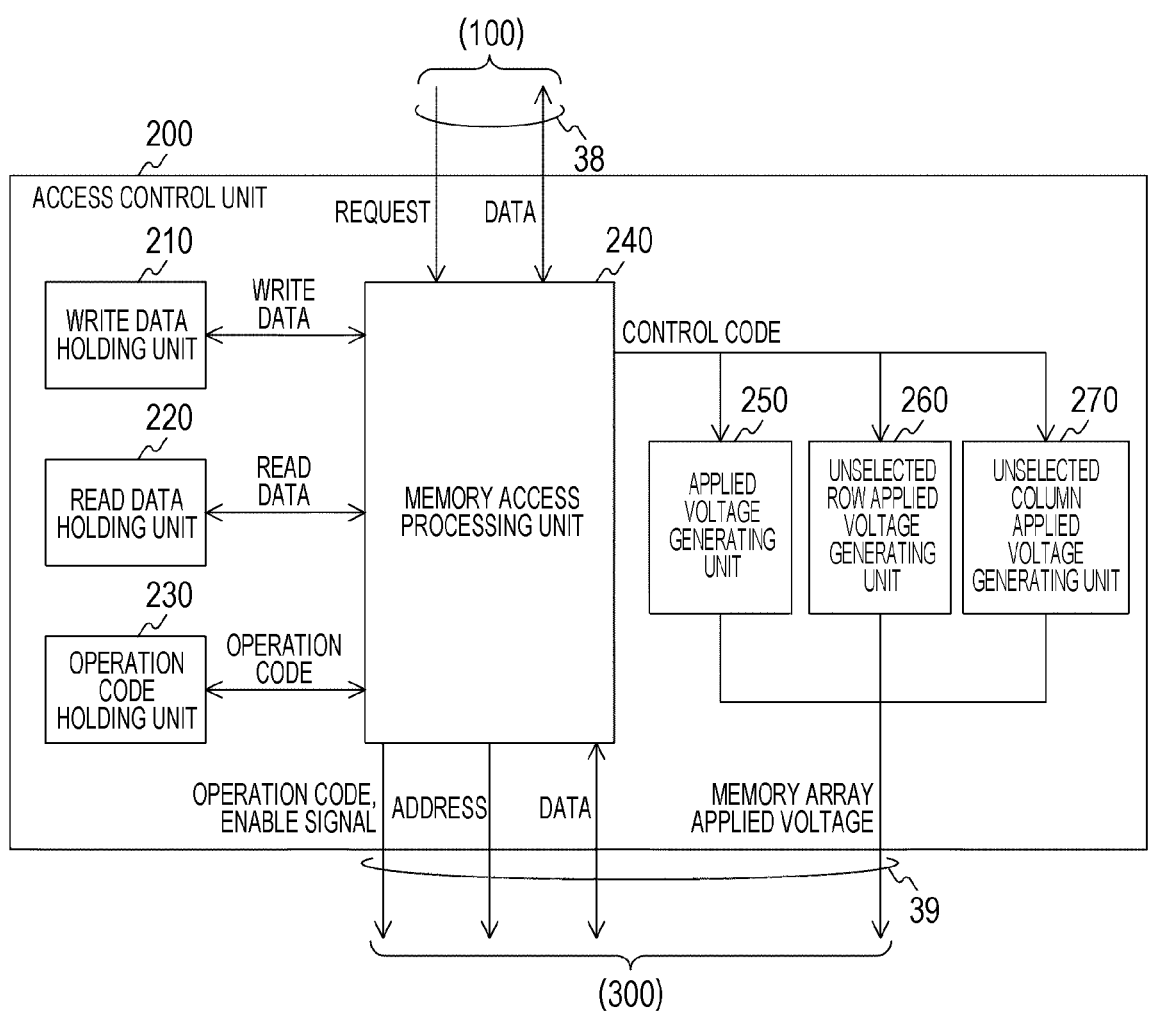
FIG. 21 is a view illustrating a configuration example of an access control unit 200 in a fourth embodiment of the present technology.

FIG. 21 is a view illustrating a configuration example of an access control unit 200 in the fourth embodiment of the present technology. The access control unit 200 is different from the access control unit 200 illustrated in FIG. 2 in that this is further provided with an unselected row applied voltage generating unit 260 and an unselected column applied voltage generating unit 270.

The unselected row applied voltage generating unit 260 generates a voltage to be applied to an unselected row signal line of a memory array 300. The unselected row applied voltage generating unit 260 generates the voltage to be applied to the unselected row signal line on the basis of a control code output by a memory access processing unit 240.

The unselected column applied voltage generating unit 270 generates a voltage to be applied to an unselected column signal line of the memory array 300. The unselected column applied voltage generating unit 270 generates the voltage to be applied to the unselected column signal line on the basis of a control code output by the memory access processing unit 240.

The memory access processing unit 240 controls the unselected row applied voltage generating unit 260 and the unselected column applied voltage generating unit 270 at the time of writing to obtain the control code and hold. Also, the access control unit 200 in the third embodiment of the present technology omits the measurement of a reference threshold voltage at the time of reading and outputs fixed values Vsns_H and Vsns_L. Therefore, an applied voltage generating unit 250 may omit a function of adjusting an output voltage illustrated in FIG. 12. Processing of the memory access processing unit 240 is described later in detail.

In the fourth embodiment of the present technology, the threshold voltage of the control element 301 of the half-selected row memory cell and that of the half-selected column memory cell are estimated by the reference threshold voltage. Then, at the time of writing, a voltage lower than the threshold voltage is applied to the half-selected row memory cell and the half-selected column memory cell. This makes it possible to prevent the control element 301 in the half-selected row memory cell and the half-selected column memory cell at the time of writing from changing to the conduction state. The memory access processing unit 240 measures the reference threshold voltage of a corresponding reference cell for each of the half-selected row memory cell and the half-selected column memory cell at the time of writing. Next, on the basis of the measured reference threshold voltage, the memory access processing unit 240 sets an unselected row voltage Vur and an unselected column voltage Vuc illustrated in FIG. 9, and applies them to the memory cell 314 and the like.

[Applied Voltage of Memory Cell]

Figure 22:
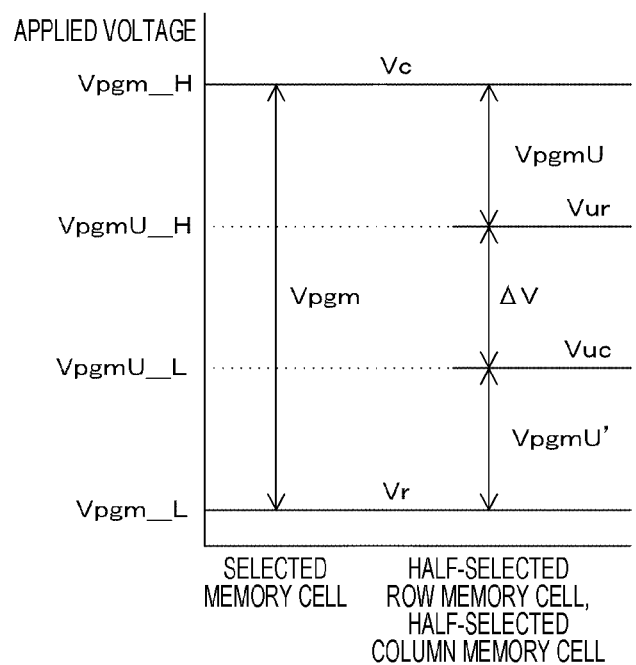
FIG. 22 is a view illustrating an applied voltage of a memory cell in the fourth embodiment of the present technology.

FIG. 22 is a view illustrating the applied voltages of the memory cell in the fourth embodiment of the present technology. This drawing illustrates a relationship of the applied voltages among a selected memory cell, the half-selected row memory cell, and the half-selected column memory cell at the time of setting. A high level unselected voltage (VpgmU_H) and a low level unselected voltage (VpgmU_L) are applied as the unselected row voltage Vur and the unselected column voltage Vuc, respectively. Therefore, VpgmU being a voltage corresponding to difference between Vpgm_H and VpgmU_H is applied to the half-selected column memory cell. Also, VpgmU' being a voltage corresponding to difference between VpgmU_L and Vpgm_L is applied to the half-selected row memory cell. Furthermore, ΔV being a voltage corresponding to difference between VpgmU_H and VpgmU_L is applied to the unselected memory cell.

VpgmU and VpgmU' are voltages set on the basis of the reference threshold voltages. By applying the voltages, it is possible to prevent the control element 301 of the half-selected row memory cell and the like from changing to the conduction state. Even in a case where a low voltage corresponding to a case where elapsed time is short is applied as VpgmU and VpgmU' while omitting the measurement of the reference threshold voltage, it is possible to prevent the control element 301 of the half-selected row memory cell and the like from changing to the conduction state. However, in this case, the voltage ΔV applied to the unselected memory cell becomes a large value and power consumption increases. In general, a memory array unit 310 and the like includes many unselected memory cells, so that it is necessary to reduce ΔV in order to reduce the power consumption of a memory 30. Therefore, as described above, it is possible to prevent an increase in power consumption by estimating the threshold of the half-selected row memory cell and the like by the reference threshold voltage and setting the applied voltage to a necessary minimum value.

The threshold of the half-selected row memory cell and the like may be estimated by the reference threshold voltage in a case of setting. This is to prevent the control element 301 from changing to the conduction state in a HRS half-selected row memory cell and the like. In a case of resetting, as in the first embodiment of the present technology, a voltage of (Vsns_H+Vsns_L)/2 is applied as Vur and Vuc.

[Operation Code]

FIG. 23 is a view illustrating an operation code in the fourth embodiment of the present technology. The operation code in this drawing is different from the operation code illustrated in FIG. 11 in that VpgmU_L and VpgmU_H are applied as Vuc and Vur at the time of setting.

[Output Voltages of Unselected Row Applied Voltage Generating Unit and Unselected Column Applied Voltage Generating Unit]

FIG. 24 is a view illustrating output voltages of the unselected row applied voltage generating unit 260 and the unselected column applied voltage generating unit 270 in the fourth embodiment of the present technology. a of this drawing illustrates a relationship between the output voltage of the unselected row applied voltage generating unit 260 and the control code. b of this drawing illustrates a relationship between the output voltage of the unselected column applied voltage generating unit 270 and the control code.

A graph 552 in a of this drawing is a graph representing a relationship between the control code and Vref_H. Also, a graph 551 is a graph representing a relationship between the control code and VpgmU_H. In a case where the control code has a value "0", Vref_H and VpgmU_H become highest voltages, and Vref_H and VpgmU_H decrease in proportion to the control code. That is, as the control code increases, the voltage to be applied to the half-selected column memory cell increases. Also, in a case where the control code is the same, VpgmU_H is higher than Vref_H by a voltage corresponding to a margin. Vcal_H is the voltage applied as Vuc and Vr. When measuring the reference threshold voltage of a reference element 303 corresponding to the half-selected column memory cell, Vpgm_H is applied to a selected column signal line and predetermined Vcal_H is applied to the unselected column signal line and a selected row signal line. Next, Vref_H being the voltage to be applied to the unselected row signal line is decreased, and the reference element 303 is turned on. When current flowing through the selected column signal line exceeds a predetermined threshold, it is possible to determine that the reference element 303 is turned on. A control code VGur_code_s when the reference element 303 is turned on is held by the memory access processing unit 240. A dashed-dotted line 553 in a of this drawing indicates an example of a threshold set for the control code VGur_code_s.

A graph 554 in b of this drawing is a graph representing a relationship between the control code and Vref_L. Also, a graph 555 is a graph representing a relationship between the control code and VpgmU_L. In a case where the control code has a value "0", Vref_L and VpgmU_L become lowest voltages, and Vref_L and VpgmU_L increase in proportion to the control code. As is the case with the half-selected column memory cell described above, the voltage applied to the half-selected row memory cell increases as the control code increases. Also, in a case where the control code is the same, VpgmU_L is lower than Vref_L by a voltage corresponding to a margin. Vcal_L is the voltage applied as Vur and Vc. When measuring the reference threshold voltage of the reference element 303 corresponding to the half-selected row memory cell, Vpgm_L is applied to the selected row signal line and Vcal_L is applied to the unselected row signal line and the selected column signal line. Next, the voltage Vref_L being the voltage to be applied to the unselected column signal line is increased to turn on the reference element 303. In a case where current flowing through the selected row signal line exceeds a predetermined threshold, it is possible to determine that the reference element 303 is turned on. A control code VGuc_code_s is held by the memory access processing unit 240. A dashed-dotted line 556 in b of this drawing indicates an example of a threshold set for the control code VGuc_code_s.

[Memory Array Unit Read Processing]

Figure 25:
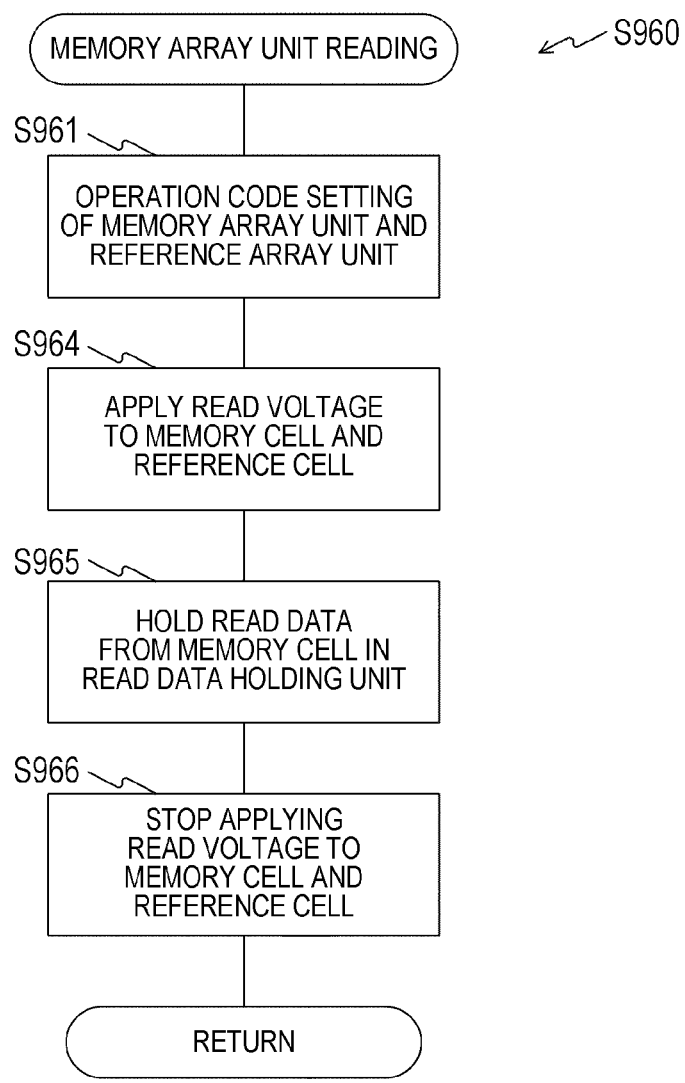
FIG. 25 is a view illustrating an example of a procedure of memory array unit read processing (step S960) in the fourth embodiment of the present technology.

FIG. 25 is a view illustrating an example of a procedure of memory array unit read processing (step S960) in the fourth embodiment of the present technology. The access control unit 200 in the fourth embodiment of the present technology executes the processing (step S960) in this drawing in place of step S910 out of the read processing illustrated in FIG. 13.

First, the memory access processing unit 240 sets the operation code of the memory array unit #1 (310) and the like and the reference array unit 390 (step S961). This may be performed by allowing an operation code holding unit 230 to hold a value "2b11" as the operation code. Next, the memory access processing unit 240 sets an enable signal to a value "1" and applies a read voltage to the memory cell 314 and the like and the reference cell 394 and the like (step S964). Next, the memory access processing unit 240 holds the read data from the memory cell 314 and the like in a read data holding unit 220 (step S965). Next, the memory access processing unit 240 sets an enable signal to a value "0" and stops applying the read voltage to the memory cell 314 and the like and the reference cell 394 and the like (step S966). In this manner, in the fourth embodiment of the present technology, it is possible to omit the measurement of the reference threshold voltage in the memory array unit read processing.

[Write Processing]

Figure 26:
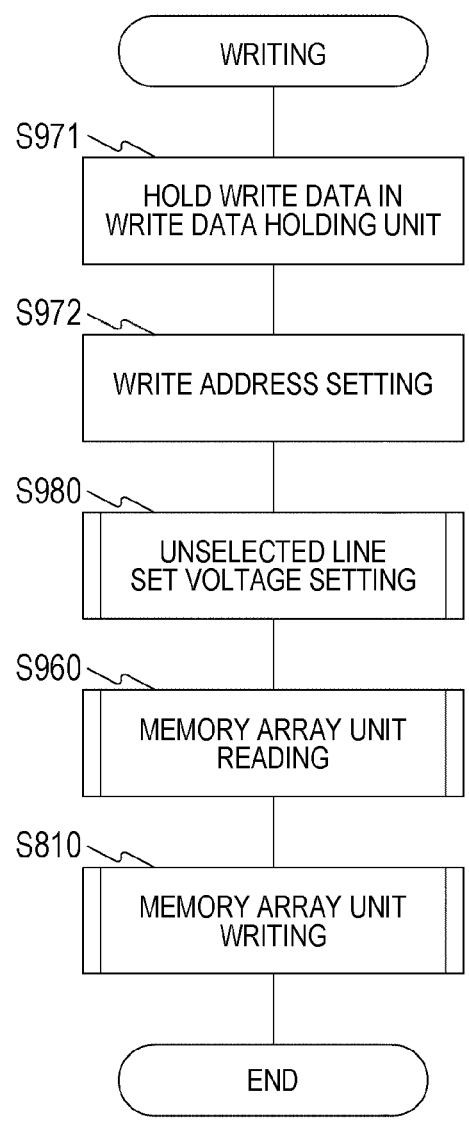
FIG. 26 is a view illustrating an example of a procedure of write processing in the fourth embodiment of the present technology.

FIG. 26 is a view illustrating an example of a procedure of write processing in the fourth embodiment of the present technology. First, the memory access processing unit 240 holds write data in a write data holding unit 210 (step S971). Next, the memory access processing unit 240 sets a write address (step S972). Next, the memory access processing unit 240 performs unselected line set voltage set processing (step S980). Next, the memory access processing unit 240 performs the memory array unit read processing illustrated in FIG. 25 (step S960). Finally, the memory access processing unit 240 performs memory array unit write processing (step S810) and ends the write processing.

[Unselected Line Set Voltage Set Processing]

Figure 27:
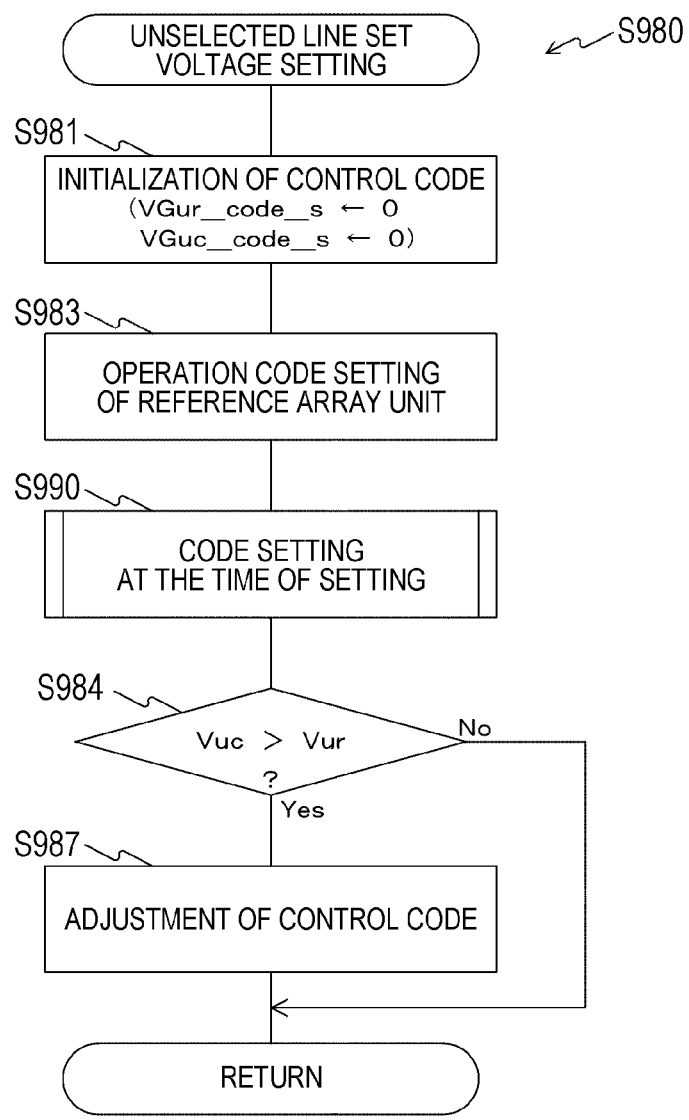
FIG. 27 is a view illustrating an example of a procedure of unselected line set voltage set processing (step S980) in the fourth embodiment of the present technology.

FIG. 27 is a view illustrating an example of a procedure of the unselected line set voltage set processing (step S980) in the fourth embodiment of the present technology. This drawing illustrates the unselected line set voltage set processing (step S980) illustrated in FIG. 26. First, the memory access processing unit 240 initializes the control codes VGur_code_s and VGuc_code_s to a value "0" (step S981). Next, the memory access processing unit 240 sets a value "2b01" as the operation code to the reference array unit (390) (step S983). Next, the memory access processing unit 240 performs code set processing at the time of setting (step S990), and holds the control codes VGur_code_s and VGuc_code_s.

Next, on the basis of these control codes, the memory access processing unit 240 determines whether the unselected column voltage Vuc is higher than the unselected row voltage Vur (step S984). In a case where the unselected column voltage Vuc is higher than the unselected row voltage Vur (step S984: Yes), the control codes VGur_code_s and VGuc_code_s are adjusted so that the unselected column voltage Vuc and the unselected row voltage Vur have the same value (step S987). In a case where the unselected column voltage Vuc is not higher than the unselected row voltage Vur (step S984: No), the memory access processing unit 240 skips the processing at step S987 and ends the unselected line set voltage set processing.

[Code Set Processing when Setting]

Figure 28:
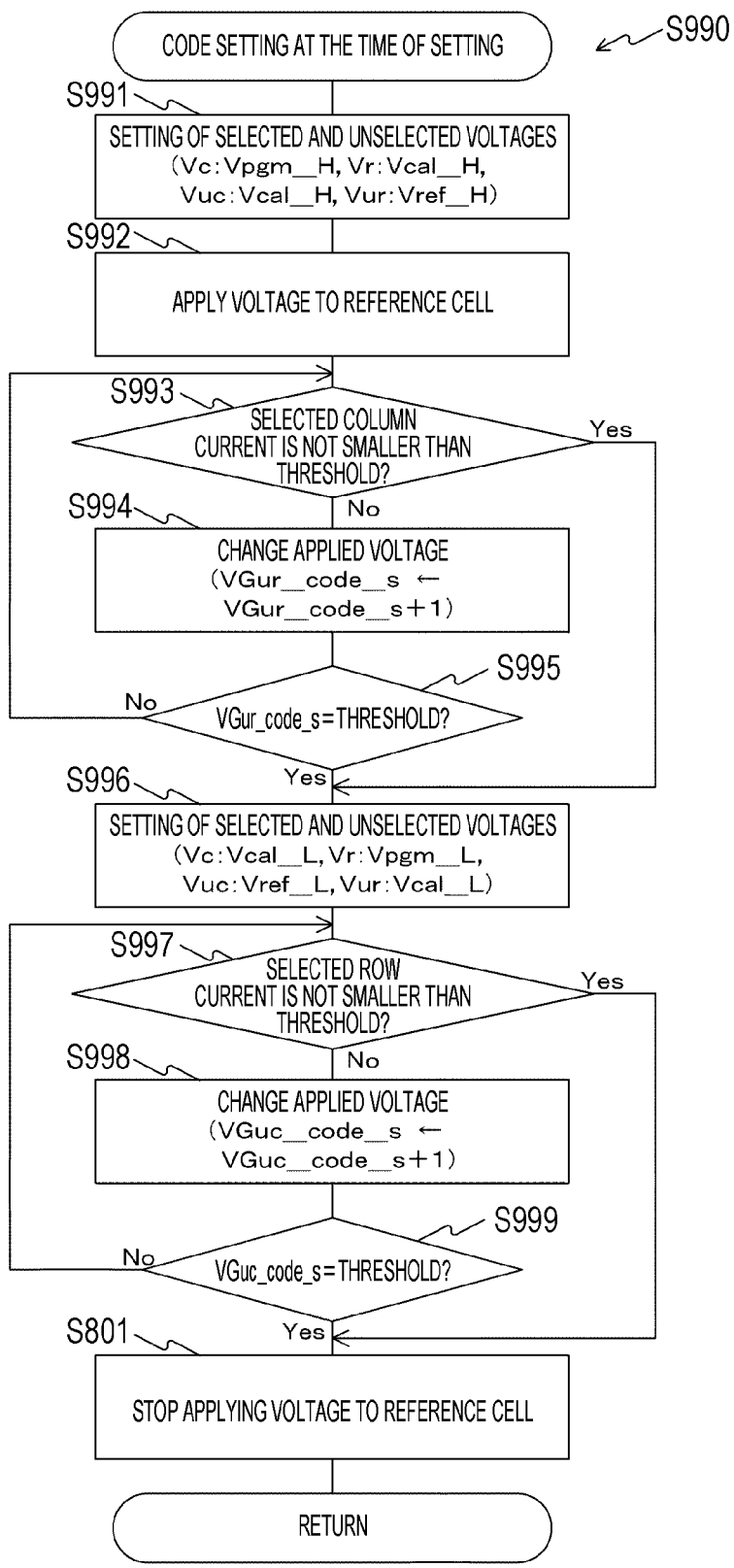
FIG. 28 is a view illustrating an example of a procedure of code set processing at the time of setting (step S990) in the fourth embodiment of the present technology.

FIG. 28 is a view illustrating an example of a procedure of the code set processing at the time of setting (step S990) in the fourth embodiment of the present technology. This drawing illustrates the code set processing at the time of setting (step S990) illustrated in FIG. 27. First, the memory access processing unit 240 sets a selected voltage and an unselected voltage (step S991). Specifically, the memory access processing unit 240 allows the applied voltage generating unit 250 to generate a selected column voltage Vc(Vpgm_H) and a selected row voltage Vr(Vcal_H). Simultaneously, the memory access processing unit 240 allows the unselected column applied voltage generating unit 270 to generate the unselected column voltage Vuc (Vcal_H), and allows the unselected row applied voltage generating unit 260 to generate the unselected row voltage Vur(Vref_H). Next, the memory access processing unit 240 sets the enable signal of the reference array unit 390 to a value "1" and applies the voltage to the reference cell 394 and the like (step S992).

Next, the memory access processing unit 240 determines whether the current flowing through a column signal line 313 corresponding to the selected column signal line is equal to or larger than a threshold (step S993). In a case where the current is equal to or larger than the threshold (step S993: Yes), the memory access processing unit 240 determines that the reference element 303 is turned on, and holds the control code VGur_code_s at that time. Thereafter, the memory access processing unit 240 shifts to processing at step S996.

On the other hand, in a case where the current is smaller than the threshold (step S993: No), the memory access processing unit 240 increments VGur_code_s and changes the applied voltage (step S994). In a case where VGur_code_s reaches the threshold as a result (step S995: Yes), the memory access processing unit 240 shifts to the processing at step S996. On the other hand, in a case where VGur_code_s does not reach the threshold (step S995: No), the memory access processing unit 240 executes from the processing at step S993 again.

At step S996, the memory access processing unit 240 sets the selected and unselected voltages (step S996). Specifically, the memory access processing unit 240 allows the applied voltage generating unit 250 to generate the selected column voltage Vc(Vcal_L) and the selected row voltage Vr(Vpgm_L). Simultaneously, the memory access processing unit 240 allows the unselected column applied voltage generating unit 270 to generate the unselected column voltage Vuc(Vref_L), and allows the unselected row applied voltage generating unit 260 to generate the unselected row voltage Vur(Vcal_L). Next, the memory access processing unit 240 determines whether the current flowing through a row signal line 312 corresponding to the selected row signal line is equal to or larger than the threshold (step S997). In a case where the current is equal to or larger than the threshold (step S997: Yes), the memory access processing unit 240 determines that the reference element 303 is turned on, and holds the control code VGuc_code_s at that time. Thereafter, the memory access processing unit 240 shifts to processing at step S801.

On the other hand, in a case where the current is smaller than the threshold (step S997: No), the memory access processing unit 240 increments VGuc_code_s and changes the applied voltage (step S998). In a case where VGuc_code_s reaches the threshold as a result (step S999: Yes), the memory access processing unit 240 shifts to the processing at step S801. On the other hand, in a case where VGuc_code_s does not reach the threshold (step S999: No), the memory access processing unit 240 executes from the processing at step S997 again. At step S801, the memory access processing unit 240 sets the enable signal of the reference array unit 390 to the value "0" and stops applying the voltage to the reference cell 394 and the like (step S801), and ends the code set processing at the time of setting.

[Memory Array Unit Write Processing]

Figure 29:
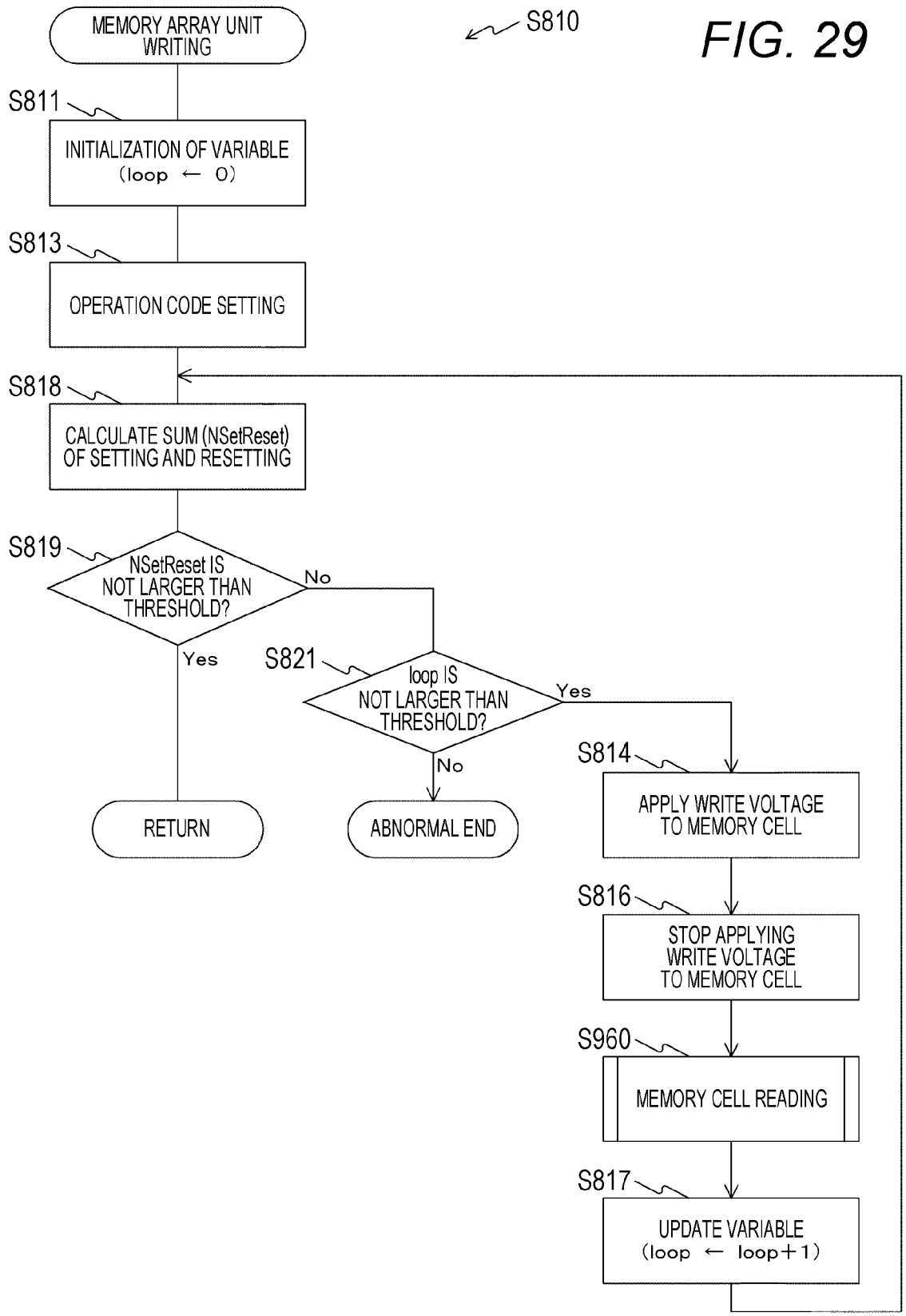
FIG. 29 is a view illustrating an example of a procedure of memory array unit write processing (step S810) in the fourth embodiment of the present technology.

FIG. 29 is a view illustrating an example of a procedure of the memory array unit write processing (step S810) in the fourth embodiment of the present technology. This illustrates the memory array unit write processing (step S810) illustrated in FIG. 26. First, the memory access processing unit 240 initializes a variable loop to a value "0" (step S811). Next, the memory access processing unit 240 sets the operation codes of the memory array units #1 (310) to #8 (380) (step S813). This is performed by setting the operation codes of the memory array unit #1 (310) and the like on the basis of the preread data and the write data and allowing the operation code holding unit 230 to hold the same. Next, the memory access processing unit 240 calculates NSetReset (step S818).

In a case where NSetReset is equal to or smaller than a predetermined threshold (step S819: Yes), the memory access processing unit 240 determines that the writing is successful and ends the memory array unit write processing.

On the other hand, in a case where NSetReset is larger than the predetermined threshold (step S819: No), the memory access processing unit 240 determines whether the variable loop is not larger than a predetermined threshold (step S821). In a case where the variable loop reaches the predetermined threshold (step S821: No), the memory access processing unit 240 abnormally ends the memory array unit write processing without returning to the original write processing.

On the other hand, in a case where the variable loop is not larger than the predetermined threshold (step S821: Yes), the memory access processing unit 240 sets the enable signal of the memory array unit #1 (310) and the like to the value "1" and applies a write voltage to the memory cell 314 and the like (step S814). After the lapse of predetermined writing time, the memory access processing unit 240 sets the enable signal of the memory array unit #1 (310) and the like to the value "0" and stops applying the write voltage to the memory cell 314 and the like (step S816). Next, the memory access processing unit 240 performs memory cell read processing (step S960) and allows the read data holding unit 220 to hold the read data as new preread data. Next, the memory access processing unit 240 increments the variable loop to update (step S817), and shifts to the processing at step S818.

Since a configuration of the access control unit 200 other than this is similar to the configuration of the access control unit 200 illustrated in FIG. 2, a description thereof is omitted. Meanwhile, also in the fourth embodiment of the present technology, as in the first embodiment of the present technology, it is possible to estimate the threshold voltage of the control element 301 of the memory cell by the reference threshold voltage at the time of reading. In this case, the memory array unit read processing illustrated in FIG. 14 is executed in place of the memory array unit read processing illustrated in FIG. 25.

In this manner, in the fourth embodiment of the present technology, the threshold voltage of the control element 301 of the half-selected row memory cell and that of the half-selected column memory cell at the time of setting are estimated by the reference threshold voltage, and the voltage is applied to the half-selected row memory cell and the half-selected column memory cells. This prevents the control element 301 in the half-selected row memory cell and the half-selected column memory cell from changing to the conduction state. The voltage applied to the variable resistance element 302 of the half-selected row memory cell and the like is decreased and an influence on a storage state of the variable resistance element is reduced, so that reliability of stored data may be improved.

5. Fifth Embodiment

In the fourth embodiment described above, the threshold voltage of the control element 301 of the half-selected row memory cell and that of the half-selected column memory cell are estimated by the reference threshold voltage at the time of setting. On the other hand, in a fifth embodiment of the present technology, a threshold voltage of a control element 301 of a half-selected row memory cell and that of a half-selected column memory cell are estimated by a reference threshold voltage at the time of setting and resetting. This prevents the control element 301 of the half-selected row memory cell and that of the half-selected column memory cell from changing to a conduction state at the time of setting and resetting. A voltage applied to a variable resistance element 302 of the half-selected row memory cell and the like is decreased and reliability of stored data is improved.

[Operation Code]

FIG. 30 is a view illustrating an operation code in the fifth embodiment of the present technology. The operation code in this drawing is different from the operation code illustrated in FIG. 23 in that VpgmU_H and VpgmU_L are applied as Vuc and Vur of resetting operation. In this manner, in the fifth embodiment of the present technology, VpgmU_H and VpgmU_L are applied to the half-selected row memory cell and the like at the time of both setting and resetting.

[Output Voltages of Unselected Row Applied Voltage Generating Unit and Unselected Column Applied Voltage Generating Unit]

FIG. 31 is a view illustrating output voltages of an unselected row applied voltage generating unit 260 and an unselected column applied voltage generating unit 270 in the fifth embodiment of the present technology. This drawing illustrates a relationship between the output voltages of the unselected row applied voltage generating unit 260 and the unselected column applied voltage generating unit 270 and the control codes at the time of resetting. a of this drawing illustrates the output voltage of the unselected row applied voltage generating unit 260, and b of this drawing illustrates the output voltage of the unselected column applied voltage generating unit 270. Meanwhile, the relationship between the output voltages of the unselected row applied voltage generating unit 260 and the unselected column applied voltage generating unit 270 and the control codes at the time of setting is similar to the relationship between the output voltage of the unselected row applied voltage generating unit 260 and the control code and the like illustrated in FIG. 24, so that the description thereof is omitted.

A graph 561 in a of this drawing is a graph representing the relationship between the control code and VpgmU_L. A graph 562 is a graph representing the relationship between the control code and Vref_L. Vref_L and VpgmU_L increase in proportion to the control code. Also, VpgmU_L is lower than Vref_L by a voltage corresponding to a margin. When measuring the reference threshold voltage corresponding to the half-selected column memory cell, Vpgm_L is applied to a selected column signal line and predetermined Vcal_L is applied to the unselected column signal line and a selected row signal line. Next, Vref_L being the voltage to be applied to the unselected row signal line is increased to turn on a reference element 303, and a control code VGur_code_r at that time is held, thereby measuring the reference threshold voltage. Dashed-dotted line 563 in a of this drawing indicates an example of the threshold set for the control code VGur_code_r.

A graph 564 in b of this drawing is a graph representing the relationship between the control code and Vref_H. A graph 565 is a graph representing the relationship between the control code and VpgmU_H. Vref_H and VpgmU_H decrease in proportion to the control code. Also, VpgmU_H is higher than Vref_H by a voltage corresponding to a margin. When measuring the reference threshold voltage corresponding to the half-selected row memory cell, Vpgm_H is applied to the selected row signal line and predetermined Vcal_H is applied to the unselected row signal line and the selected column signal line. Next, Vref_H being the voltage to be applied to the unselected column signal line is decreased to turn on the reference element 303, and a control code VGuc_code_r at that time is held, thereby measuring the reference threshold voltage. Dashed-dotted line 566 in b of this drawing indicates an example of a threshold set for the control code VGuc_code_r.

[Write Processing]

Figure 32:
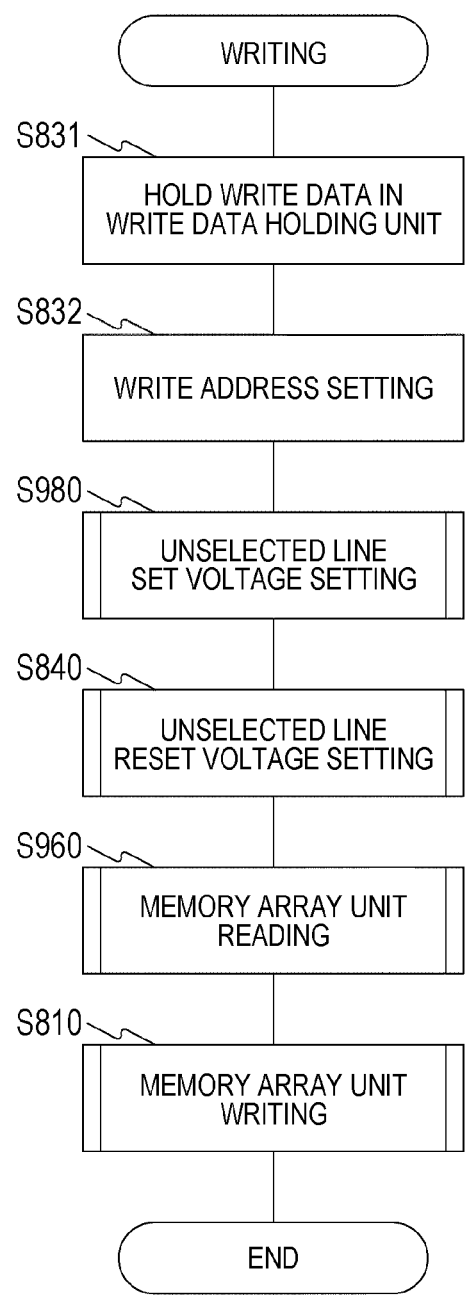
FIG. 32 is a view illustrating an example of a procedure of write processing in the fifth embodiment of the present technology.

FIG. 32 is a view illustrating an example of a procedure of write processing in the fifth embodiment of the present technology. First, a memory access processing unit 240 holds write data in a write data holding unit 210 (step S831). Next, the memory access processing unit 240 sets a write address (step S832). Next, the memory access processing unit 240 performs unselected line set voltage set processing (step S980) illustrated in FIG. 27. Next, the memory access processing unit 240 performs unselected line reset voltage set processing (step S840). Next, the memory access processing unit 240 performs memory array unit read processing (step S960) illustrated in FIG. 25. Finally, the memory access processing unit 240 performs memory array unit write processing (step S810) illustrated in FIG. 29 and ends the write processing.

[Unselected Line Reset Voltage Set Processing]

Figure 33:
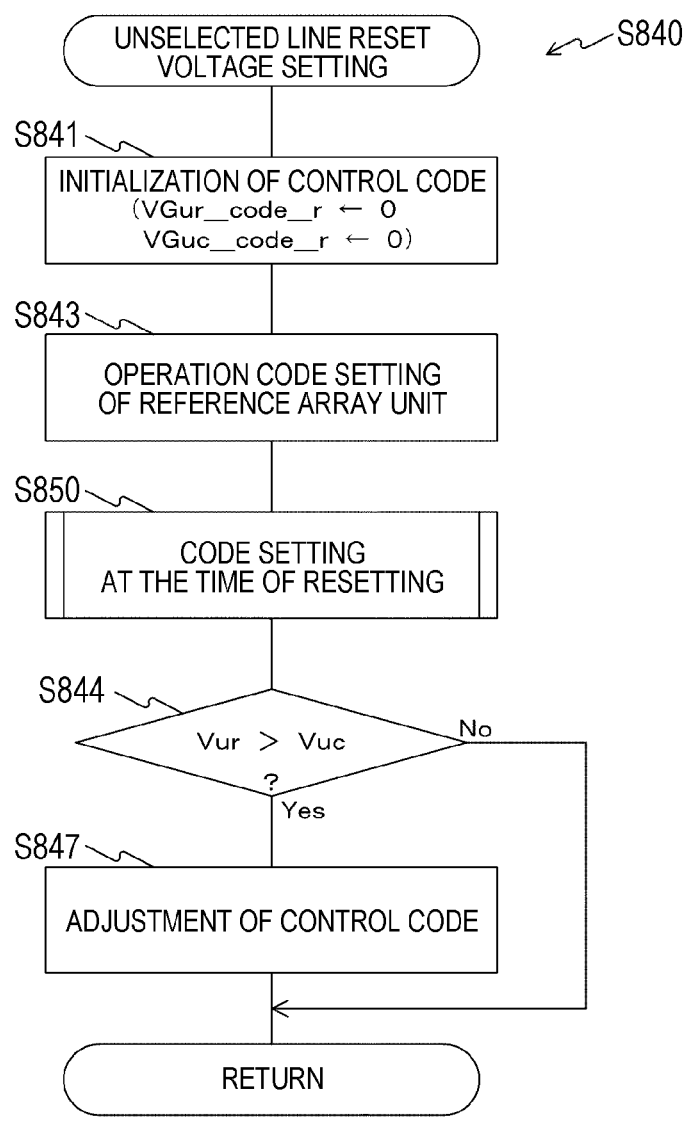
FIG. 33 is a view illustrating an example of a procedure of unselected line reset voltage set processing (step S840) in the fifth embodiment of the present technology.

FIG. 33 is a view illustrating an example of a procedure of unselected line reset voltage set processing (step S840) in the fifth embodiment of the present technology. This drawing illustrates the unselected line reset voltage set processing (step S840) illustrated in FIG. 32. First, the memory access processing unit 240 initializes control codes VGur_code_r and VGuc_code_r to a value "0" (step S841). Next, the memory access processing unit 240 sets a value "2b10" as the operation code for a reference array unit 390 (step S843). Next, the memory access processing unit 240 performs code set processing at the time of resetting (step S850) and obtains the control codes VGur_code_r and VGuc_code_r.

Next, on the basis of the control codes, the memory access processing unit 240 determines whether the unselected row voltage Vur is higher than the unselected column voltage Vuc (step S844). In a case where the unselected row voltage Vur is higher than the unselected column voltage Vuc (step S844: Yes), the control codes VGur_code_r and VGuc_code_r are adjusted so that the unselected row voltage Vur and the unselected column voltage Vuc are the same value (step S847). In a case where the unselected row voltage Vur is not higher than the unselected row voltage Vuc (step S844: No), the memory access processing unit 240 skips the processing at step S847 and ends the unselected line reset voltage set processing.

[Code Set Processing at Resetting]

Figure 34:
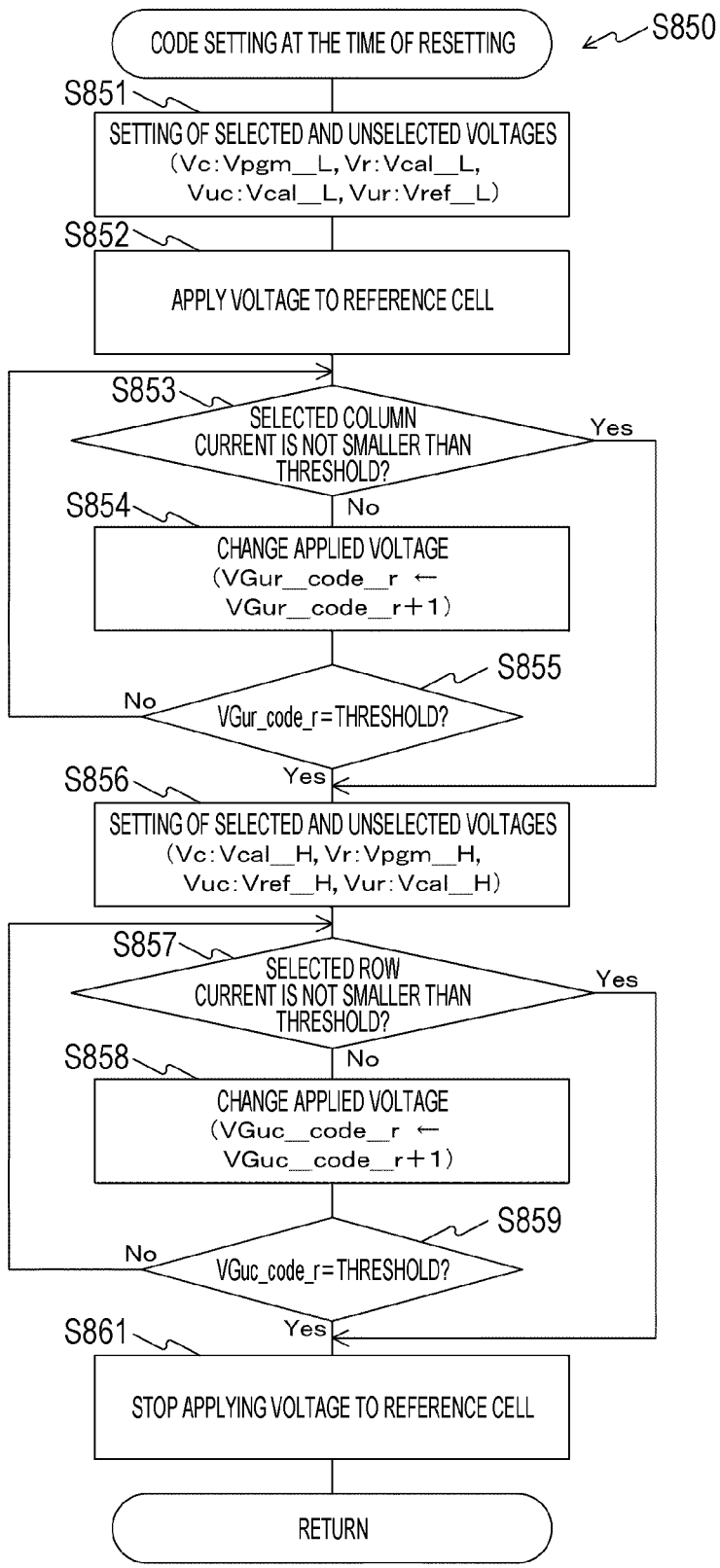
FIG. 34 is a view illustrating an example of a procedure of code set processing at the time of resetting (step S850) in the fifth embodiment of the present technology.

FIG. 34 is a view illustrating an example of a procedure of the code set processing at the time of resetting (step S850) in the fifth embodiment of the present technology. This drawing illustrates the code set processing at the time of resetting (step S850) illustrated in FIG. 33. First, the memory access processing unit 240 sets selected and unselected voltages (step S851). Specifically, the memory access processing unit 240 allows an applied voltage generating unit 250 to generate a selected column voltage Vc(Vpgm_L) and a selected row voltage Vr(Vcal_L). Simultaneously, the memory access processing unit 240 allows the unselected column applied voltage generating unit 270 to generate the unselected column voltage Vuc(Vcal_L) and allows the unselected row applied voltage generating unit 260 to generate the unselected row voltage Vur(Vref_L). Next, the memory access processing unit 240 sets an enable signal of the reference array unit 390 to a value "1" and applies a voltage to the reference cell 394 and the like (step S852).

Next, the memory access processing unit 240 determines whether current flowing through a column signal line 313 corresponding to the selected column signal line is equal to or larger than a threshold (step S853). In a case where the current is equal to or larger than the threshold (step S853: Yes), the memory access processing unit 240 holds the control code VGur_code_r at that time and shifts to processing at step S856.

On the other hand, in a case where the current is smaller than the threshold (step S853: No), the memory access processing unit 240 increments VGur_code_r and changes the applied voltage (step S854). In a case where VGur_code_r reaches the threshold as a result (step S855: Yes), the memory access processing unit 240 shifts to the processing at step S856. On the other hand, in a case where VGur_code_r does not reach the threshold (step S855: No), the memory access processing unit 240 executes from the processing at step S853 again.

At step S856, the memory access processing unit 240 sets the selected and unselected voltages (step S856). Specifically, the memory access processing unit 240 allows the applied voltage generating unit 250 to generate the selected column voltage Vc(Vcal_H) and the selected row voltage Vr(Vpgm_H). Simultaneously, the memory access processing unit 240 allows the unselected column applied voltage generating unit 270 to generate the unselected column voltage Vuc(Vref_H), and allows the unselected row applied voltage generating unit 260 to generate the unselected row voltage Vur(Vcal_H). Next, the memory access processing unit 240 determines whether current flowing through a row signal line 312 corresponding to the selected row signal line is equal to or larger than a threshold (step S857). In a case where the current is equal to or larger than the threshold (step S857: Yes), the memory access processing unit 240 holds the control code VGuc_code_s and shifts to processing at step S861.

On the other hand, in a case where the current is smaller than the threshold (step S857: No), the memory access processing unit 240 increments VGuc_code_r and changes the applied voltage (step S858). In a case where VGuc_code_r reaches the threshold as a result (step S859: Yes), the memory access processing unit 240 shifts to the processing at step S861. On the other hand, in a case where VGuc_code_r does not reach the threshold (step S859: No), the memory access processing unit 240 executes from the processing at step S857 again. Finally, the memory access processing unit 240 sets the enable signal of the reference array unit 390 to the value "0", stops applying the voltage to the reference cell 394 and the like (step S861), and ends the code set processing at the time of resetting.

Meanwhile, since the read processing is similar to the read processing described in the fourth embodiment of the present technology, the description thereof is omitted. Since a configuration of the access control unit 200 other than this is similar to the configuration of the access control unit 200 illustrated in FIG. 21, the description thereof is omitted.

In this manner, in the fifth embodiment of the present technology, as compared with the fourth embodiment, the threshold voltage of the control element 301 of the half-selected row memory cell and the like is estimated by the reference threshold voltage also at the time of resetting. Therefore, the change of the control element 301 of the half-selected row memory cell and the like to the conduction state at the time of setting and resetting is prevented. Since the voltage applied to the variable resistance element 302 of the half-selected row memory cell and the like is decreased also at the time of resetting, the reliability of the stored data may be further improved.

[Variation]

In the fifth embodiment of the present technology described above, the reference threshold voltage is measured at the time of setting and resetting. On the other hand, it is also possible to estimate a threshold voltage of a control element 301 of a half-selected row memory cell and the like at the time of resetting by a reference threshold voltage measured at the time of setting, and apply a voltage to the half-selected row memory cell and the like. Specifically, control codes VGur_code_r and VGuc_code_r having the same values as control codes VGur_code_s and VGuc_code_s obtained at the time of setting may be used to set an unselected row applied voltage Vur and the like at the time of resetting. In a case where there is no significant difference in characteristics of the control element 301 in a case where polarities of applied voltages are different, the same control code may be used at the time of setting and resetting. As a result, it becomes possible to omit measurement of the reference threshold voltage at the time of resetting.

6. Sixth Embodiment

In the first embodiment described above, the memory cell including the variable resistance element 302 and the control element 301 of a type to apply a voltage bi-directionally is used. On the other hand, in a sixth embodiment of the present technology, a memory cell including a variable resistance element and a control element of a type to apply a voltage in a single direction is adopted, thereby simplifying a memory system.

[Configurations of Memory Cell and Reference Cell]

Figure 35:
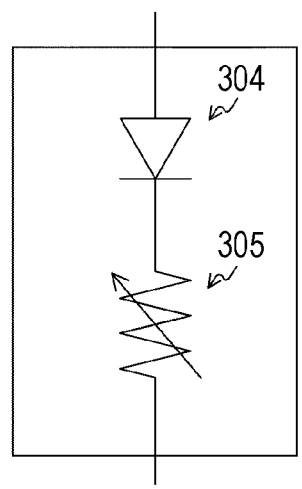
FIG. 35 is a view illustrating a configuration example of a memory cell and a reference cell in a sixth embodiment of the present technology.

FIG. 35 is a view illustrating a configuration example of the memory cell and a reference cell in the sixth embodiment of the present technology. This drawing illustrates an example of the memory cell including a control element 304 and a variable resistance element 305 connected in series and a reference cell. As the control element 304, for example, a diode may be used. Also, as the variable resistance element 305, for example, it is possible to use the variable resistance element 305 including a PCRAM. The variable resistance element 305 is a variable resistance element which reversibly changes the variable resistance element 305 to a non-crystalline state and a crystalline state by controlling magnitude of write current and the like at the time of writing. The non-crystalline state and the crystalline state correspond to HRS and LRS, respectively. In a memory having such a configuration, a reference memory cell is arranged to measure a reference threshold voltage. A threshold voltage of the control element 304 is estimated by the measured reference threshold voltage, and a voltage is applied to the memory cell. In a case of using the memory cell of a type to apply a voltage in a single direction, it is not necessary to change polarity of the applied voltage, so that a configuration of an array driving unit 311 and the like may be simplified as compared with a system using the memory cell of a type to apply a voltage bi-directionally. Also, a unidirectional control element 304 may have a simpler configuration than that of a bi-directional control element 301.

Since a configuration of a memory 30 other than this is similar to the configuration of the memory 30 described in the first embodiment of the present technology, the description thereof is omitted.

As described above, according to the sixth embodiment of the present technology, since the memory cell including the variable resistance element 305 and the control element 304 of a type to apply a voltage in a single direction is used, it is possible to simplify the configuration of the memory cell, an array driving unit 311 and the like.

7. Seventh Embodiment

In the above-described first embodiment, the memory cell including the variable resistance element 302 and the control element 301 is used. On the other hand, in a seventh embodiment of the present technology, a memory cell including a single element is adopted, thereby simplifying a memory system.

[Configurations of Memory Cell and Reference Cell]

Figure 36:
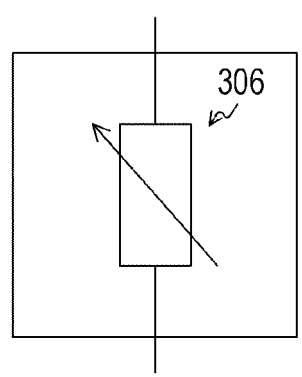
FIG. 36 is a view illustrating a configuration example of a memory cell and a reference cell in a seventh embodiment of the present technology.

FIG. 36 is a view illustrating a configuration example of a memory cell and a reference cell in the seventh embodiment of the present technology. This drawing illustrates an example of the memory cell and the reference cell including an element 306. The element 306 is an element which changes from a non-conduction state to a conduction state according to an applied voltage at a threshold voltage and changes to a high resistance state and a low resistance state according to the voltage applied in the conduction state. In the memory cell having such a configuration, a reference memory cell is arranged and a reference threshold voltage is measured. The threshold voltage of the element 306 is estimated from the measured reference threshold voltage, and a voltage is applied to the memory cell.

Since a configuration of a memory 30 other than this is similar to the configuration of the memory 30 described in the first embodiment of the present technology, the description thereof is omitted.

As described above, in the seventh embodiment of the present technology, the memory cell including the element 306 which changes from the non-conduction state to the conduction state according to the applied voltage, and changes to the high resistance state to the low resistance state according to the voltage applied in the conduction state is used. Therefore, a configuration of the memory cell may be simplified.

As described above, in the embodiment of the present technology, the threshold voltage is estimated by the reference threshold voltage and the voltage is applied to the memory cell. Therefore, in a case in which the threshold of the control element in the memory cell changes, the minimum necessary voltage for putting the control element into the conduction state may be applied, and the reliability of the stored data may be improved without increasing the power consumption.

Meanwhile, the above-described embodiments describe an example for embodying the present technology, and there is a correspondence relationship between the matters in the embodiments and the matters specifying the invention in claims. Similarly, there is a correspondence relationship between the matters specifying the invention in claims and the matters in the embodiments of the present technology having the same names. However, the present technology is not limited to the embodiments and may be embodied with various modifications of the embodiment without departing from the spirit thereof.

Also, the procedures described in the above-described embodiments may be considered as a method including a series of procedures and may be considered as a program for allowing a computer to execute the series of procedures and a recording medium which stores the program. A compact disc (CD), a MiniDisc (MD), a digital versatile disc (DVD), a memory card, a Blu-ray™ Disc and the like may be used, for example, as the recording medium.

Meanwhile, the effect described in this specification is illustrative only and is not limitative; there may also be another effect.

Meanwhile, the present technology may also have a following configuration.

(1) A memory including:

a memory cell which changes from a non-conduction state to a conduction state according to an applied voltage at a threshold voltage and changes to a high resistance state and a low resistance state according to a voltage applied in the conduction state;

a reference cell including a reference element which changes from a non-conduction state to a conduction state according to an applied voltage at a reference threshold voltage; and an access control unit which estimates the reference threshold voltage measured in the reference cell to be the threshold voltage of the memory cell and applies a voltage to the memory cell at a time of access to the memory cell.

(2) The memory according to (1) described above, in which the memory cell includes a control element which changes from the non-conduction state to the conduction state according to an applied voltage at the threshold voltage, and a variable resistance element which changes to the high resistance state and the low resistance state according to an applied voltage.

(3) The memory according to (1) or (2) described above, in which the access control unit changes the reference element from the non-conduction state to the conduction state to measure the reference threshold voltage at a time of reading.

(4) The memory according to (1) to (3) described above, in which the data cell is accessed in units of pages divided according to a page size, the reference cell is arranged for each of the pages, and the access control unit estimates that the reference threshold voltage is the threshold voltage of the memory cell for each page and applies a voltage to the memory cell.

(5) The memory according to (4) described above, in which a plurality of reference cells is arranged for each page, and the access control unit estimates the threshold voltage of the memory cell by reference threshold voltages in the plurality of reference cells.

(6) The memory according to (4) described above, in which the access control unit changes the reference element from the non-conduction state to the conduction state to measure the reference threshold voltage at a time of reading in the page.

(7) The memory according to (6) described above, in which, in a case where there is the memory cell in the high resistance state after writing in the page, the access control unit changes the memory cell in the low resistance state of the page to the conduction state, sets elapsed time after the change to be substantially equal to or shorter than the elapsed time of the memory cell in the high resistance state, and estimates the reference threshold voltage to be the threshold voltage of the memory cell in the page.

(8) The memory according to (1) described above, further including:

a plurality of row signal lines and a plurality of column signal lines arranged in an XY matrix pattern, in which a plurality of memory cells is arranged at intersections of the plurality of row signal lines and the plurality of column signal lines to be connected to one of the plurality of row signal lines at the intersections and one of the plurality of column signal lines at the intersections, the reference cell is arranged for each of the plurality of memory cells, and the access control unit estimates the reference threshold voltage of the reference cell arranged for each of the plurality of memory cells to be the threshold voltage of the memory cell and applies a voltage to each of the memory cells.

(9) The memory according to (8) described above, in which the access control unit selects one of the plurality of row signal lines and one of the plurality of column signal lines to perform the access.

(10) The memory according to (9) described above, in which, when the access control unit writes in the memory cell connected to a selected row signal line being one of the plurality of row signal lines and a selected column signal line being one of the plurality of column signal lines, the access control unit estimates a threshold voltage of a half-selected row memory cell being the memory cell connected to the selected row signal line and a column signal line other than the selected column signal line and a threshold voltage of a half-selected column memory cell being the memory cell connected to the selected column signal line and a row signal line other than the selected row signal line by the reference threshold voltage and applies a voltage to the half-selected row memory cell and the half-selected column memory cell.

(11) The memory according to (1) described above, further including:

an error detecting/correcting unit which performs error detection and error correction on read data according to the access, in which the access control unit estimates the reference threshold voltage to be the threshold voltage of the memory cell when an error of the read data is detected by the error detecting/correcting unit and applies a voltage to the memory cell.

(12) An information processing system including:

a memory including:

a memory cell which changes from a non-conduction state to a conduction state according to an applied voltage at a threshold voltage and changes to a high resistance state and a low resistance state according to a voltage applied in the conduction state;

a reference cell including a reference element which changes from a non-conduction state to a conduction state according to an applied voltage at a reference threshold voltage; and an access control unit which estimates the reference threshold voltage measured in the reference cell to be the threshold voltage of the memory cell and applies a voltage to the memory cell at a time of access to the memory cell; and a host computer which accesses to the memory.

(13) A method of controlling a memory including:

an access control procedure of estimating that a reference threshold voltage measured in a reference cell including a reference element which changes from a non-conduction state to a conduction state according to an applied voltage at the reference threshold voltage is a threshold voltage of a memory cell which changes from a non-conduction state to a conduction state according to an applied voltage at the threshold voltage and changes to a high resistance state and a low resistance state according to the voltage applied in the conduction state, and applying a voltage to the memory cell at a time of access to the memory cell.

REFERENCE SIGNS LIST

10 Host computer
20 Memory controller
21 Host computer interface
22 Memory access control unit
23 Error detecting/correcting unit
24 Memory interface
30 Memory
100 Memory controller interface
200 Access control unit
210 Write data holding unit
220 Read data holding unit
230 Operation code holding unit
240 Memory access processing unit
250 Applied voltage generating unit
260 Unselected row applied voltage generating unit
270 Unselected column applied voltage generating unit
300 Memory array
301, 304 Control element
302, 305 Variable resistance element
303 Reference element
306 Element
310 to 380 Memory array unit 311, 391 Array driving unit
312, 392 Row signal line
313, 393 Column signal line
314 to 317 Memory cell
390, 490 Reference array unit
394 to 397 Reference cell

The invention claimed is:

1. A memory comprising:
a memory array that comprises a reference cell and a memory cell; and
an access control unit that is electrically connected to the memory array,
wherein the reference cell is configured to:
  switch, when a reference access voltage transitions to a level that exceeds a reference threshold voltage of the reference cell, from a non-conduction state to a conduction state,
wherein the memory cell is configured to:
  switch, when a memory access voltage transitions to a level that exceeds a threshold voltage of the memory cell, from the non-conduction state to the conduction state,
wherein the access control unit is configured to:
  apply, to the reference cell, the reference access voltage,
  obtain, by measuring the reference access voltage that the access control unit applies to the reference cell, the reference threshold voltage of the reference cell,
  estimate, by processing the reference threshold voltage of the reference cell, the threshold voltage of the memory cell, and
  apply, to the memory cell, the memory access voltage.

2. The memory according to claim 1, wherein the memory cell is configured to:
switch, when a signal applied to the memory cell transitions from a low logic level to a high logic level while is the memory cell is in the conduction state, from a low resistance state to a high resistance state.

3. The memory according to claim 2, wherein the memory cell is configured to:
switch, when the signal applied to the memory cell transitions from the high logic level to the low logic level while is the memory cell is in the conduction state, from the high resistance state to the low resistance state.

4. The memory according to claim 2, wherein the high logic level is a logic 0.

5. The memory according to claim 2, wherein the low logic level is a logic 1.

6. The memory according to claim 2, wherein switching between the high resistance state and the low resistance state is inhibited when the memory cell is in the non-conduction state.

7. The memory according to claim 1, wherein the reference cell is at an intersection of a row reference cell signal line and a column reference cell signal line.

8. The memory according to claim 7, wherein the row reference cell signal line and the column reference cell signal line are electrically connected to the reference cell.

9. The memory according to claim 1, wherein the memory cell is at an intersection of a row memory cell signal line and a column memory cell signal line.

10. The memory according to claim 9, wherein the row memory cell signal line and the column memory cell signal line are electrically connected to the memory cell.

11. The memory according to claim 1, wherein a control element of the memory cell is electrically connected to a variable resistance element of the memory cell.

12. The memory according to claim 11, wherein the control element of the memory cell is in series with the variable resistance element of the memory cell.

13. The memory according to claim 11, wherein the control element of the memory cell permits the memory cell to switch between the non-conduction state and the conduction state.

14. The memory according to claim 11, wherein the variable resistance element of the memory cell permits the memory cell to switch between the high resistance state and the low resistance state.

15. An information processing system comprising:
the memory according to claim 1; and
a host computer configured to access the memory.

16. A method of controlling a memory, the method comprising:
applying, to a reference cell from an access control unit, a reference access voltage;
obtaining, from the reference access voltage by the access control unit when the access control unit measures the reference access voltage that is applied to the reference cell, a reference threshold voltage that causes the reference cell to switch from a non-conduction state to a conduction state;
estimating, from the reference threshold voltage by the access control unit, a threshold voltage of a memory cell;
applying, to the memory cell from the access control unit, a memory access voltage; and
switching, when the memory access voltage transitions to a level that exceeds the threshold voltage of the memory cell, the memory cell from the non-conduction state to the conduction state,
wherein the access control unit is electrically connected to a memory array, the memory array that comprises the reference cell and the memory cell.

17. The method according to claim 16, further comprising:
inhibiting, when the memory cell is in the non-conduction state, switching the memory cell between a high resistance state and a low resistance state.

* * * * *